(12) United States Patent
Taniguchi et al.

(10) Patent No.: US 7,888,173 B2
(45) Date of Patent: Feb. 15, 2011

(54) SEMICONDUCTOR DEVICE MANUFACTURING METHOD

(75) Inventors: Harutaka Taniguchi, Matsumoto (JP); Yoshinari Ikeda, Matsumoto (JP)

(73) Assignee: Fuji Electric Device Technology Co., Ltd., Tokyo (JP)

( * ) Notice: Subject to any disclaimer, the term of this patent is extended or adjusted under 35 U.S.C. 154(b) by 184 days.

(21) Appl. No.: 12/382,412

(22) Filed: Mar. 12, 2009

(65) Prior Publication Data

US 2009/0246910 A1 Oct. 1, 2009

(30) Foreign Application Priority Data

Mar. 25, 2008 (JP) ............................. 2008-077478

(51) Int. Cl.
*H01L 21/00* (2006.01)
(52) U.S. Cl. .............................. 438/107; 257/E21.502; 438/127
(58) Field of Classification Search ......... 438/106–127, 438/612–617; 257/E21.502
See application file for complete search history.

(56) References Cited

U.S. PATENT DOCUMENTS

| 6,399,426 B1 * | 6/2002 | Capote et al. ............... 438/127 |
| 2006/0220213 A1 | 10/2006 | Kondou et al. |
| 2007/0048900 A1 * | 3/2007 | Jiang et al. ................. 438/106 |

FOREIGN PATENT DOCUMENTS

| JP | 2003-273357 A | 9/2003 |
| JP | 2003-289130 A | 10/2003 |
| JP | 2004-228403 A | 8/2004 |
| JP | 2005-19830 A | 1/2005 |
| JP | 2005-116702 A | 4/2005 |
| JP | 2006-237429 A | 9/2006 |
| JP | 2006-261168 A | 9/2006 |

* cited by examiner

*Primary Examiner*—Richard A. Booth
(74) *Attorney, Agent, or Firm*—Manabu Kanesaka

(57) ABSTRACT

A semiconductor device manufacturing method includes the steps of preparing a semiconductor element having a first electrode, a second electrode, and a third electrode facing the first electrode and second electrode, the first electrode and second electrode being electrically separated by an insulating layer; arranging a first conductive bonding material on a first metal foil and placing the semiconductor element on the first conductive bonding material; supporting a sheet-shape second conductive bonding material by the insulating layer; arranging a first post electrode and a second post electrode above the first and second electrodes respectively with the second conductive bonding material intervening therebetween; and forming a first conductive bonding layer for bonding the first electrode and the first post electrode, a second conductive bonding layer for bonding the second electrode and the second post electrode, and a third conductive bonding layer for bonding the third electrode and the first metal foil.

16 Claims, 21 Drawing Sheets

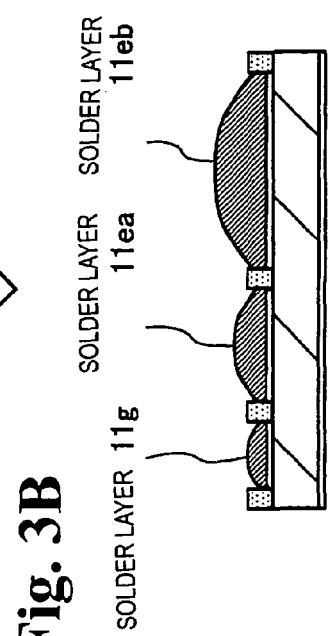
Fig. 3C
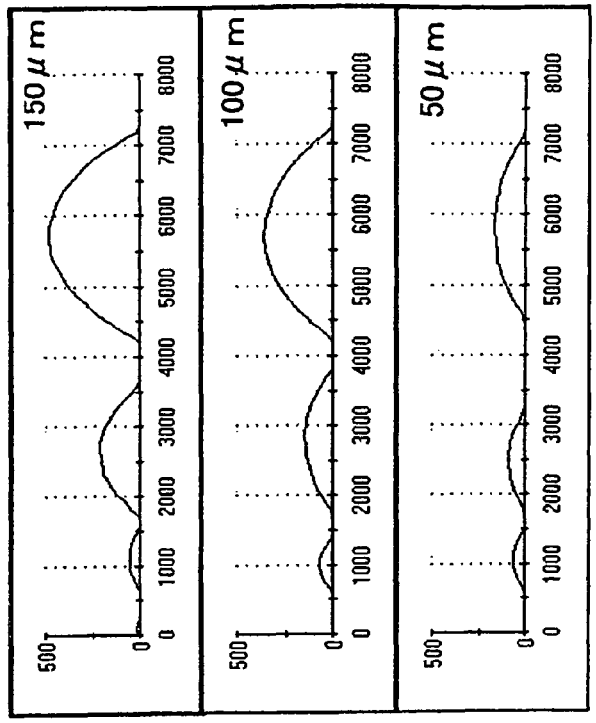
Fig. 3D
| THICKNESS OF SOLDER MATERIAL 11 (μm) | GATE 10g (μm) | EMITTER 10ea (μm) | EMITTER 10eb (μm) |
|---|---|---|---|
| 150 | 57 | 249 | 475 |
| 100 | 73 | 229 | 363 |
| 50 | 69 | 246 | 243 |
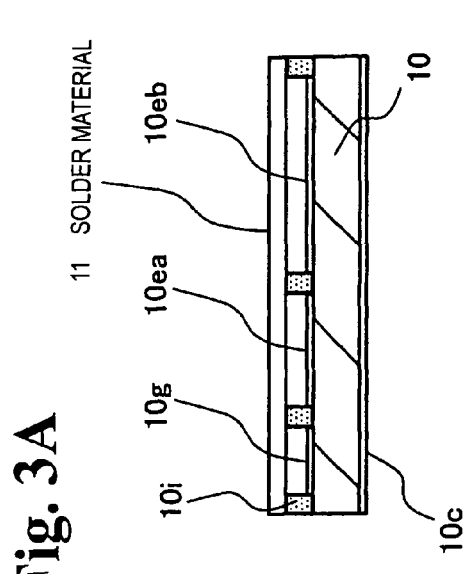
Fig. 3A
Fig. 3B

| SOLDER MATERIAL THICKNESS (μm) | UPPER-FACE SIDE ELECTRODES (μm) |
|---|---|
| 150 | 765 |
| 100 | 558 |
| 50 | 314 |

SOLDER LAYER    SUBSTRATE

SOLDER LAYER    SUBSTRATE

Fig. 11

|  | Al/Ni/Au ELECTRODE | Cu SHEET | POLYIMIDE FILM |
|---|---|---|---|
| $H_2O$ | - | - | 93.0 TO 111.7 |
| SN3.5%Ag | 0.50 TO 9.58 | 28.10 TO 38.00 | 99.7 TO 129.4 |
| Sn5%Sb | 1.89 TO 6.82 | 42.30 TO 57.30 | 80.0 TO 146.8 |
| Sn37%Pb | 1.44 TO 3.97 | 5.40 TO 8.10 | 143.0 TO 150.6 |

SEMICONDUCTOR DEVICE MANUFACTURING METHOD

BACKGROUND OF THE INVENTION AND RELATED ART STATEMENT

The present invention relates to a semiconductor device manufacturing method, and in particular relates to a method of manufacturing a semiconductor device provided with a plurality of power semiconductor elements.

In inverter devices, uninterruptible power supply devices, machine tools, industrial robots, and other devices, semiconductor devices provided with a plurality of power semiconductor elements are used independently of the main-unit devices. Recently, in order to pass larger currents, there has been interested in wireless-structure semiconductor devices which do not use bonding wires (see for example Japanese Patent Laid-open No. 2004-228403).

FIG. 21 shows principal portions of a wireless-structure semiconductor device.

The semiconductor device 100 shown in the figure comprises a metal base sheet 101, insulating sheet 102 bonded onto the metal base sheet 101, and conductor patterns 103a, 103b, 103c, 103d patterned on the insulating sheet 102; a semiconductor element 105 is bonded via a solder layer 104b onto the conductor pattern 103b.

Also, a transformer 106, capacitor 107, resistor 108, and other elements are electrically connected to the conductor pattern 103d via the solder layer 104d. And, an external leadout terminal 109, which leads to outside the semiconductor device 100, is electrically connected to the conductor pattern 103a via the solder layer 104a.

Here, the semiconductor element 105 is a vertical-type power semiconductor element, configured with the electrode on the rear-face side connected to the conductor pattern 103b via the solder layer 104b.

Also, in the semiconductor device 100, a print board 110 faces the metal base sheet 101. On the print board 110 are provided a through-hole 110a and conductor patterns 111 and 113.

And, a post electrode 112a which is electrically connected to the conductor pattern 111 is bonded to an electrode on the upper-face side of the semiconductor element 105, via the solder layer 104e. Further, a post electrode 112b electrically connected to another conductor pattern 111 is bonded to the conductor pattern 103c via the solder layer 104c. And, a control IC 114 is mounted on the conductor pattern 113.

In this way, in a semiconductor device 100, a wireless structure is employed, and the upper-face side electrode of the semiconductor element 105 and the conductor pattern 103c are electrically connected to the print board 110 via the post electrodes 112a and 112b.

However, in the above-described solder layer 104e, since ordinarily paste-form solder material comprising a flux component is applied to the electrodes of the semiconductor element 105 using a printing method, so that after reflow, flux cleaning of the electrode surface has been necessary. And, because the solder material is in paste form, during reflow, there has been a problem of scattering of the flux component or solder material.

Also, the recent miniaturization of semiconductor elements have been accompanied by reductions in the weight of the semiconductor elements 105 themselves, so that when paste-form solder material is applied using a printing method, the semiconductor element 105 moves, and there is a problem of the occurrence of variations in the position of application of the paste-form solder.

Further, there are variations in the heights of the post electrodes 112a. As to post electrodes having relatively short distances, there has been a problem that the lower portion of the post electrode cannot be adequately bonded to an electrode via a solder layer.

This invention has been made in light of the above problems. This invention has as an object the provision of a semiconductor device manufacturing method enabling manufacture of semiconductor devices of high reliability and excellent operating characteristics, and high production yields.

Further objects and advantages of the invention will be apparent from the following description of the invention.

SUMMARY OF THE INVENTION

In order to resolve the above problems, in one aspect of the invention, a semiconductor device manufacturing method comprises: a process of preparing a semiconductor element having at least one first electrode, at least one second electrode, and a third electrode arranged so as to face the first electrode and second electrode, with the first electrode and second electrode being electrically separated in the same face or plane by an insulating layer; a process of arranging a first conductive bonding material on a metal foil formed on a main face of an insulating sheet, and placing the semiconductor element on the first conductive bonding material so as to be in contact with the third electrode; a process of supporting a sheet-shape second conductive bonding material by the insulating layer, so as to face the first electrode and second electrode of the semiconductor element; a process of causing the lower end of at least one first post electrode and the lower end of at least one second post electrode, which are electrically connected to a wiring layer arranged on a wiring board, to face the first electrode and second electrode respectively, with the second conductive bonding material intervening therebetween; and a process of separating the second conductive bonding material, with the insulating layer interposed, and bonding the first electrode and the first post electrode with the first conductive bonding layer intervening therebetween, and bonding the second electrode and the second post electrode with the second conductive bonding layer intervening therebetween, and bonding the third electrode and the metal foil with a third conductive bonding layer intervening.

Further, in another aspect of the invention, a semiconductor device manufacturing method comprises: a process of preparing a semiconductor element having at least one first electrode and at least one second electrode, with the first electrode and second electrode electrically separated in the same face by an insulating layer; a process of supporting a sheet-shape first conductive bonding material by the insulating layer, so as to face the first electrode and second electrode; a process of arranging the lower end of at least one first post electrode and the lower end of at least one second post electrode, which are electrically connected to a wiring layer arranged on a wiring board, over the first electrode and second electrode respectively, with the first conductive bonding material intervening therebetween; and a process of separating the first conductive bonding material, with the insulating layer interposed, and bonding the first electrode and the first post electrode with the first conductive bonding layer intervening therebetween, and bonding the second electrode and the second post electrode with a second conductive bonding layer intervening therebetween.

By this means, a semiconductor device manufacturing method enables the manufacturing with high production yields for semiconductor devices with high reliability and having excellent operating characteristics.

BRIEF DESCRIPTION OF THE DRAWINGS

FIGS. 3A to 3D are second diagrams to explain the semiconductor device manufacturing method of the first aspect.

FIG. 11 is a tenth diagram to explain the semiconductor device manufacturing method of the first aspect.

DETAILED DESCRIPTION OF PREFERRED EMBODIMENTS

First Embodiment

Figure 1:
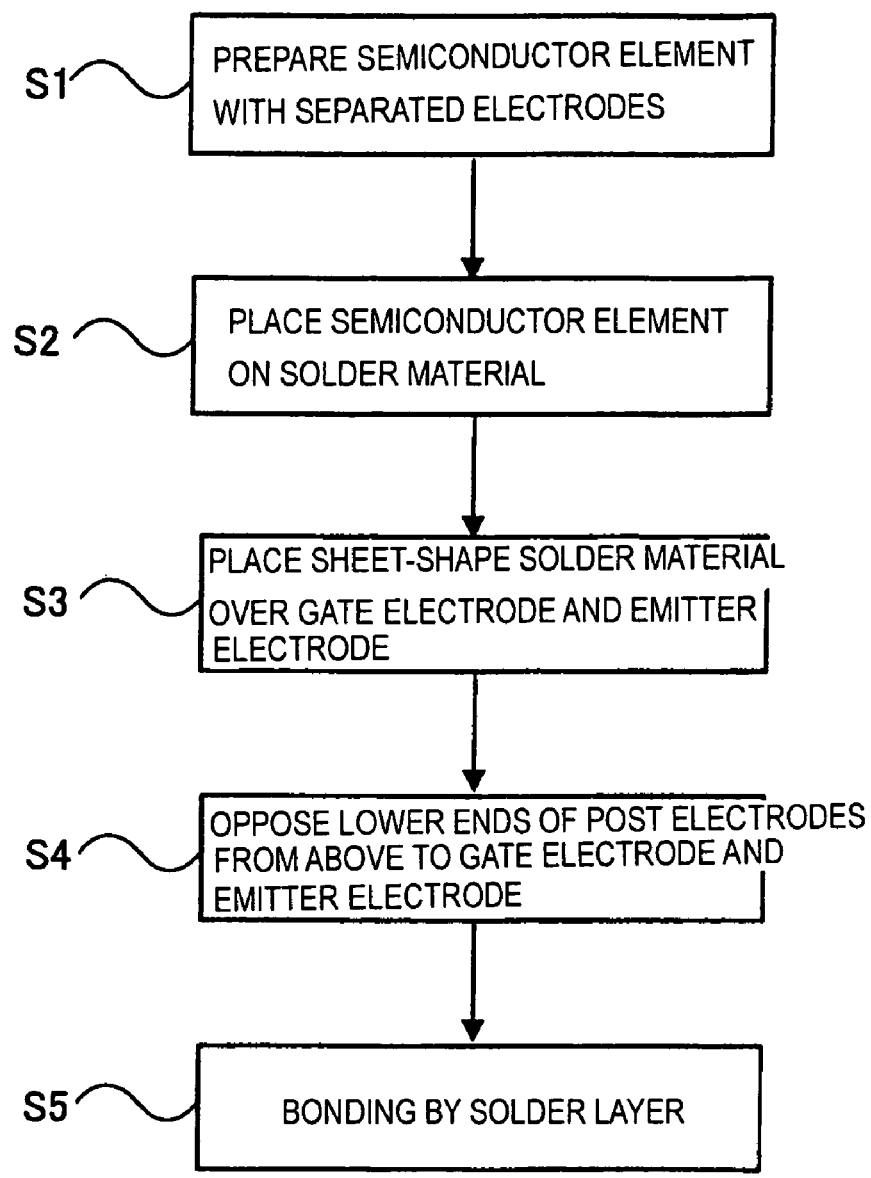
FIG. 1 is a flow diagram to explain the semiconductor device manufacturing method of a first aspect.

Below, the semiconductor device manufacturing method of a first aspect is explained in detail, referring to the drawings.

FIG. 1 is a flow diagram to explain the semiconductor device manufacturing method of a first aspect. In the semiconductor device manufacturing method of the first aspect, an example is shown in which, for example, a vertical-type IGBT (Insulated Gate Bipolar Transistor) element is used as the semiconductor element; however, the semiconductor element used in the semiconductor device manufacturing method is not limited to an IGBT element.

First, a semiconductor element is prepared such that at least one gate electrode (first electrode), which is the electrode used for control, and at least one emitter electrode (second electrode), which is a main electrode, are provided, and such that a collector electrode (third electrode) is provided so as to face the gate electrode and emitter electrode, said collector electrode being another main electrode. The gate electrode and emitter electrode are electrically separated in the same face by an insulating layer (step S1).

Next, a first conductive bonding material (solder material) is placed on a metal foil formed by the DCB (Direct Copper Bonding) method on a main face of an insulating sheet. Further, the semiconductor element is placed such that the semiconductor element collector electrode is in contact with the solder material (step S2).

Then, a sheet-shape second conductive bonding material (solder material) is supported by the insulating layer, and placed on the gate electrode and emitter electrode of the semiconductor element (step S3).

Next, the lower end of at least one post electrode (first post electrode) and the lower end of at least one other post electrode (second post electrode), which are connected via the wiring layer provided on the wiring board (print board), are arranged to face the gate electrode and emitter electrode respectively, with the solder material intervening (step S4).

Then, the first conductive bonding material and sheet-shape second conductive bonding material are melted by means of reflow treatment. After separating the sheet-shape second conductive bonding material with the insulating layer interposed, the gate electrode and post electrode are bonded via the first conductive bonding layer (solder layer) formed on the gate electrode, and the emitter electrode and other post electrode are bonded via the second conductive bonding layer (solder layer) formed on the emitter electrode. Further, the collector electrode and metal foil are bonded via a third conductive bonding layer (solder layer) (step S5).

Here, prior to separating the second conductive bonding material with the insulating layer interposed, the gate electrode and emitter electrode, or the post electrode and other post electrode, may be subjected to preprocessing (described below).

Also, the sheet-shape second conductive bonding material is within a range of a prescribed thickness.

Further, in the semiconductor element, the contact angle of the second conductive bonding material with respect to the insulating layer is greater than that of the second conductive bonding material with respect to the gate electrode or emitter electrode (explained below). Further, the contact angle of the second conductive bonding material with respect to the insulating layer is greater than that of the second conductive bonding material with respect to the post electrode or the other post electrode (explained below).

By means of this process, a semiconductor device with high reliability and excellent operating characteristics can be manufactured.

Here, as to the first to third electrodes, the gate electrode, emitter electrode, and collector electrode are positioned in this order. However, this is one example, and the arrangement is not limited to this example. Any one of the first electrode through the third electrode can be any one of the gate electrode, emitter electrode, and collector electrode. Further, each of the first to third electrodes may be different from other two electrodes.[i]

Next, a specific method of manufacture of the semiconductor device of the first aspect is explained, based on the flow diagram of FIG. 1, and FIG. 2A to FIG. 13B.

FIG. 2A to FIG. 13B are drawings to explain the method of manufacture of a semiconductor device of the first aspect.

Figure 2A:
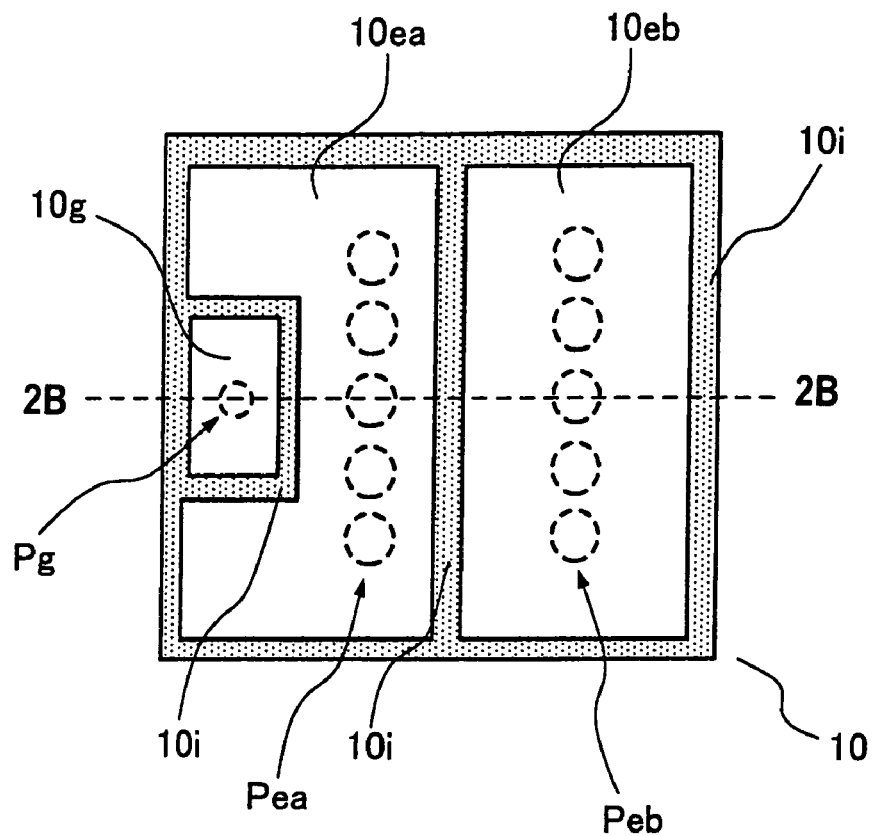
FIGS. 2A and 2B are first diagrams to explain the semiconductor device manufacturing method of the first aspect.
Figure 2B:
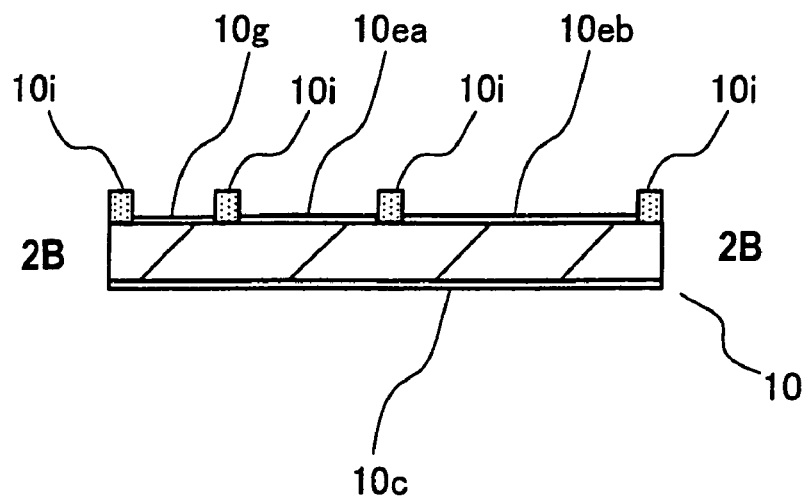

In FIGS. 2A and 2B, an example of principal portions of a semiconductor element used in the semiconductor device manufacturing method is shown. FIG. 2A is a plan view of principal portions of the semiconductor element, and FIG. 2B is a cross-sectional view of the position along the dashed line 2B-2B in FIG. 2A. In the specific example described below also, an example is explained in which a vertical-type IGBT element is used. However, in the semiconductor device manufacturing method of the first aspect, the semiconductor element used is not limited to an IGBT element.

For example, in place of an IGBT element, a power MOSFET (Metal Oxide Semiconductor Field Effect Transistor) element or similar may be used. Also, a FWD (Free Wheeling Diode), in which positive and negative electrodes are arranged on upper and lower main faces, may be incorporated into the semiconductor device together with the semiconductor element 10.

In the semiconductor element 10 shown, a gate electrode (first electrode) 10g, which is a control electrode, and emitter electrodes (second electrodes) 10ea, 10eb, which are main electrodes, are arranged on the upper face side, while a collector electrode (third electrode) 10c is arranged on the lower face side. The material of the gate electrode 10g, emitter electrodes 10ea and 10eb, and collector electrode 10c may, for example, be aluminum (Al) or copper (Cu) as the main component. The surfaces of these electrodes may be coated with a film of, from the lower layer, nickel (Ni)/gold (Au). Such coating layers are formed in order to improve the wettability and bonding properties of solder material formed on the electrodes.

A coating layer may be formed by, for example, electroless plating, evaporation deposition, sputtering, or other methods.

In the semiconductor element 10, the gate electrode 10g and emitter electrode 10ea are arranged with an insulating layer (separation layer) 10i having a rectangular cross-section interposed. Also, the emitter electrodes 10ea and 10eb are separated into two regions with an insulating layer 10i having a rectangular cross-section interposed.

The material of the insulating layer 10i has as the main component, for example, any one of a polyimide resin, silicon nitride (SiN), silicon oxide ($SiO_2$), or similar. The insulating layer 10i has heat resistance to 300° C. or higher.

The power capacity of the semiconductor element 10 includes, for example, a rated current of 50 A and breakdown voltage of 1200 V. The element size is, for example, 0.13 mm in thickness with planar dimensions of 8.2 mm×8.2 mm. In this aspect, the size of the semiconductor element 10 is not limited in particular to the above size, and may be an appropriate size in a range from 3 mm×3 mm to 17 mm×17 mm.

In FIG. 2A, the dashed-line points indicated by the arrows Pg, Pea, Peb indicate the bonding positions of post electrodes which are electrically connected to the gate electrode 10g and the emitter electrodes 10ea and 10eb (described below).

FIGS. 3A to 3D show an example of formation of a solder layer on the surfaces of electrodes arranged on the IGBT element. Specifically, a lead (Pb)-free solder material (melting point 220° C.) 11 is used, to form a solder layer as a conductive bonding layer on the electrode surface. For example, a sheet-shape solder material 11 which is a conductive bonding material is placed on the semiconductor element 10, and heating is performed to form a solder layer on each of the electrode surfaces.

As shown in FIG. 3A, it is preferable that the planar shape of the solder material 11 be of size same as, or somewhat smaller than, the upper face of the semiconductor element 10, and that the planar shape be rectangular.

In the example of this aspect, the planar shape of the solder material 11 is made shorter by 0.6 mm than the outer edges of the semiconductor element 10. For example, in this aspect, solder material 11 rectangular in shape and measuring 7.0 mm×7.0 mm is used.

The solder material 11 has three thicknesses including 50 μm, 100 μm, and 150 μm.

Solder material 11 with this shape faces the upper face of the semiconductor element 10 while being supported by the insulating layer 10i, and reflow treatment at 220° C. or higher is performed in a heating furnace. After the reflow treatment, the cross-section of the solder material 11 is as shown in FIG. 3B.

That is, when the sheet-shape solder material 11 is subjected to reflow treatment, the solder material 11 is completely separated with the insulating layer 10i interposed, due to the differences in wettability of the gate electrode 10g, emitter electrodes 10ea and 10eb, and insulating layer 10i, as well as to the weight of the solder material 11 itself and the surface tension of the solder material 11. And, solder layers 11g, 11ea, and 11eb are formed on the surface of the gate electrode 10g and on the surfaces of the emitter electrodes 10ea and 10eb.

Then, as shown in FIG. 3C, a three-dimensional shape measurement instrument is used to measure the profiles of the solder layers 11g, 11ea, 11eb. Result in determining the height values (the heights of the tops of the solder layers) are obtained as shown in FIG. 3D. The units in the vertical and horizontal axis directions in FIG. 3C are micrometers (μm).

That is, when 50 μm, 100 μm, and 150 μm are used as the sheet thickness of the solder material 11, a solder layer 11g of height 57 μm to 73 μm is formed on the gate electrode 10g, a solder layer 11ea of height 229 μm to 249 μm is formed on the emitter electrode 10ea, and a solder layer 11eb of height 243 μm to 475 μm is formed on the emitter electrode 10eb.

When the thickness of the solder material 11 is much less than 50 μm, or even approaching 0 μm, the absolute quantity of the solder layer is insufficient, and the solder layers 11g, 11ea, 11eb may not function as conductive bonding materials.

And, when the thickness of the solder layer 11 is made greater than 150 μm, the absolute quantity of the solder layer becomes excessive, and there is a tendency for the solder layer to span the insulating layer 10i and cause short-circuits between the gate electrode 10g and the emitter electrode 10ea. Further, if the height of the solder layer is excessive, there may be contact of the solder layer with the wiring board (described below) positioned above the semiconductor element 10.

Therefore, as the thickness of the solder layer 11 used, 5 μm to 150 μm is preferable, and 50 μm to 150 μm is more preferable.

When using a polyimide material as the insulating layer 10i, the thickness of the insulating layer 10i is made from 0.1 μm to 500 μm, and the line width is made 200 μm or greater.

In particular, by forming the insulating layer 10i higher than the highest solder layer among the solder layers 11g, 11ea, 11eb on the semiconductor element 10, the insulating layer 10i is more reliably interposed between the solder layers 11 to be separated from the gate electrode 10g or emitter electrode 10ea.

Further, as explained below, because the wettability of the solder material with respect to the insulating layer 10i is poor (low), even when the height of the insulating layer 10i is lower than that of the solder layers 11g, 11ea, 11eb, the solder material 11 is separated from the gate electrode 10g and the emitter electrode 10ea with the insulating layer 10i interposed.

However, if the thickness of the insulating layer 10i is less than 0.1 μm, there is a tendency for the poor wettability of the solder material with respect to the insulating layer 10i to be alleviated, so that the solder wets the insulating layer 10i, and also, there is a tendency for short-circuits to occur between the gate electrode 10g and emitter electrode 10ea through the solder layer.

Hence it is desirable that the thickness of the insulating layer 10i be 0.1 μm or greater.

Moreover, in order to secure an adequate breakdown voltage across the gate electrode 10g and emitter electrode 10ea by means of the insulating layer 10i, it is desirable that the thickness of the insulating layer 10i be 0.1 μm or greater.

Further, if the thickness of the insulating layer 10i is greater than 500 μm, then the insulating layer 10i may make contact with the wiring board positioned above the semiconductor element 10, and the semiconductor device cannot be made thin. Hence, it is desirable that the thickness of the insulating layer 10i is equal to or less than the gap between the semiconductor element 10 and the wiring board (from 500 μm to 2 mm).

When an IGBT element or power MOSFET with a breakdown voltage of 600 V, 1200 V, 1700 V, or similar is used as the semiconductor element 10, because the breakdown voltage of polyimide material is approximately 10 V/μm, it is desirable that the line width of the insulating layer 10i be 200 μm or greater in order to secure an adequate breakdown voltage between the gate electrode 10g and the emitter electrode 10ea.

Further, when using an IGBT element requiring a still higher breakdown voltage, the line width may be adjusted appropriately, to conform to this breakdown voltage.

Figures 4A, 4B:
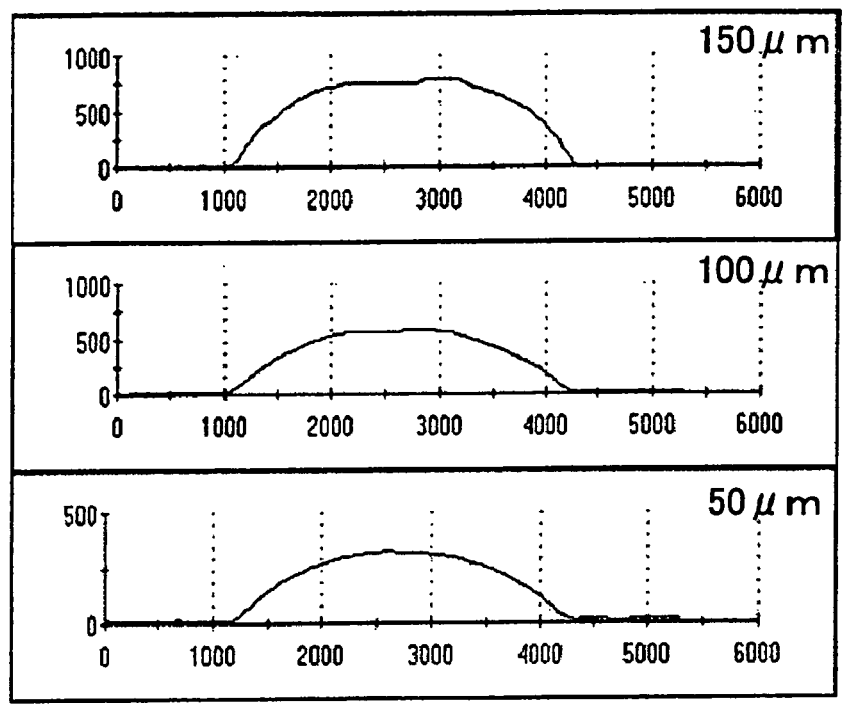
FIGS. 4A and 4B are third diagrams to explain the semiconductor device manufacturing method of the first aspect.

FIGS. 4A and 4B show an example of solder layer formation on the surface of an electrode provided on a FWD element.

That is, as shown in FIG. 4A, the measurement instrument is used to measure the profiles of solder layers formed on the electrode surfaces on the upper-face side of a FWD element, and the maximum values of the height are indicated in FIG. 4B. The units in the vertical and horizontal axis directions in FIG. 4A are micrometers (μm).

That is, when 50 μm, 100 μm, and 150 μm are used as the sheet thicknesses of the solder material used with a FWD element, a solder layer is formed with a height of 314 μm to 765 μm on the upper-face side electrode surface of the FWD element.

These solder layer heights are shifted in the higher direction relative to the solder layers 11ea and 11eb formed on the emitter electrodes 10ea and 10eb. This is due to the fact that the chip area of a FWD element is smaller than that of an IGBT element.

The height of the solder layer formed on the electrode surface of a FWD element can be adjusted freely by appropriately adjusting the thickness of the sheet-shape solder material.

Figure 5:
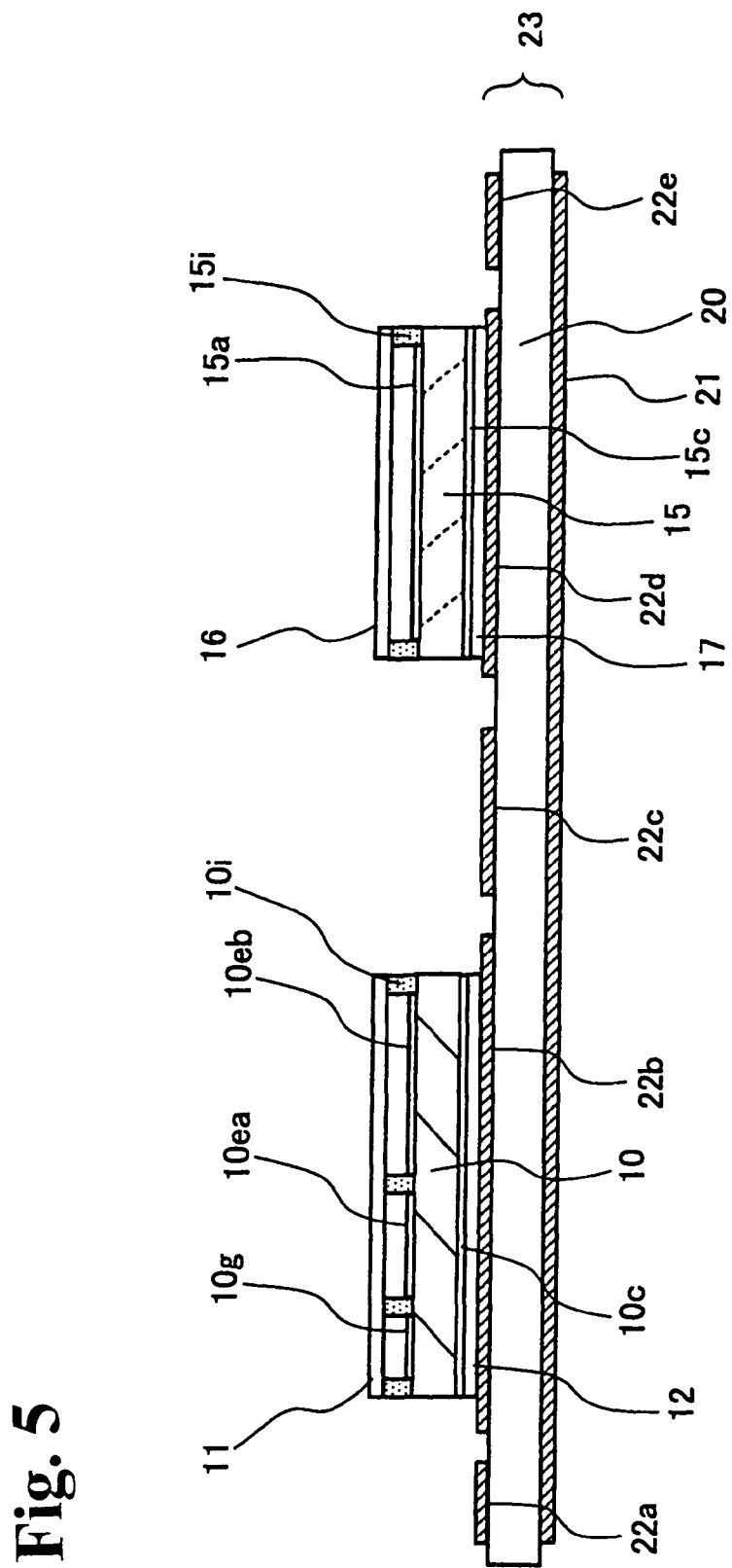
FIG. 5 is a fourth diagram to explain the semiconductor device manufacturing method of the first aspect.

Then, as shown in FIG. 5, an insulating board 23 is prepared, with metal foil 21, 22a to 22e formed in patterns by the DCB method on the upper and lower main faces of an insulating sheet 20, the main component of which is for example alumina ($Al_2O_3$) or silicon nitride ($Si_3N_4$). This insulating board 23 is fixed and supported on the lower face and side faces by means of, for example, a carbon fastening jig (not shown).

Next, the solder materials (first conductive bonding material) 12 and 17 are placed on the metal foil 22b and metal foil 22d. The solder materials 12, 17 may have sheet shapes, or may be in paste form. Then, the semiconductor element 10 is placed on the solder material 12 such that the collector electrode 10c of the semiconductor element 10 is in contact with the solder material 12.

Also, a FWD element or another semiconductor element 15 is prepared, and the semiconductor element 15 is placed on the solder material 17 such that the cathode electrode (fifth electrode) 15c of the semiconductor element 15 is in contact with the solder material 17.

Then, the sheet-shape solder material (second conductive bonding material) 11 is supported by the insulating layer 10i arranged on the upper-face side of the semiconductor element 10, with a main face of the solder material 11 facing the gate electrode 10g and emitter electrodes 10ea, 10eb. Similarly, the sheet-shape solder material 16 is supported by the insulating layer 15i arranged on the upper-face side of the semiconductor element 15, with a main face of the solder material 16 facing the anode electrode (fourth electrode) 15a of the semiconductor element 15.

At this stage the thicknesses of the solder materials 11 and 16 which are used are, as explained above, from 50 μm to 150 μm. Further, the planar sizes of the solder materials 11 and 16 are sizes same as the main faces of the semiconductor elements 10 and 15. As a result, alignment of the solder materials 11, 16 with respect to the semiconductor elements 10, 15 is made easy.

Moreover, solder materials 11 and 16 which are somewhat smaller in size than the main faces of the semiconductor elements 10 and 15 may be used. For example, solder materials 11 and 16 which are from 60% to 100% of the area of the main faces of the semiconductor elements 10 and 15 may be used. However, the sizes must be such that the edges of the solder materials 11 and 16 are supported without fail by the insulating layers 10i, 15i formed on the outer peripheries of the semiconductor elements 10 and 15.

These solder materials 11, 12, 16, 17 are manufactured by punching from a large-size solder sheet. The solder materials 11, 12, 16, 17 do not contain flux.

The material of the solder materials 11, 12, 16, 17 is for example a lead (Pb)-free solder, and specifically is an Sn 3.5%-Ag solder or other SnAg system solder, or an Sn 5%-Sb solder or other SnSb system solder. In addition, an SnAgCu system solder, SnAgBi system solder, SnAgIn system solder, SnCuBi system solder, SnCuIn system solder, or SnAgCu-NiGe system solder may be used.

Moreover, a lead (Pb)-containing solder (eutectic solder) may be used if necessary. Specifically, an Sn 5%-Pb solder, Sn 63%-Pb solder, or Sn 37%-Pb solder may be used.

Figure 6:
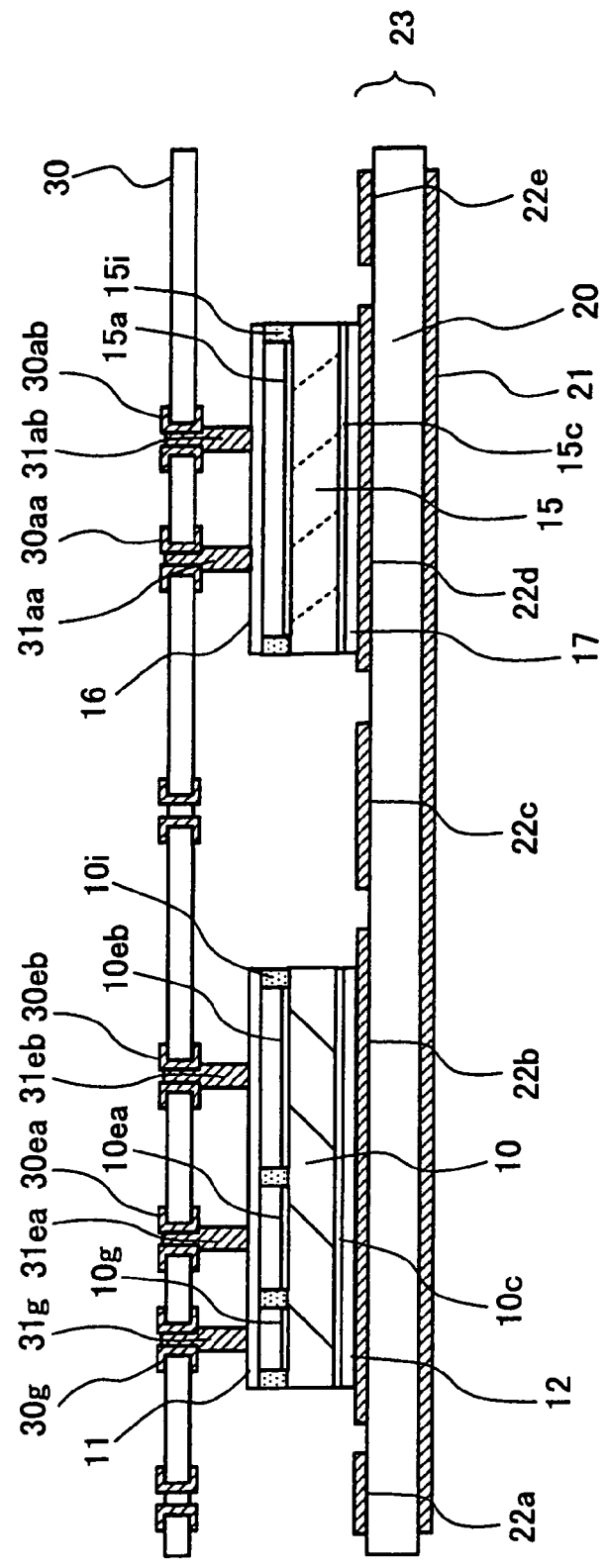
FIG. 6 is a fifth diagram to explain the semiconductor device manufacturing method of the first aspect.

Next, as shown in FIG. 6, a wiring board 30 is prepared. A wiring pattern is arranged selectively on this wiring board 30. And, the lower end of a post electrode (first post electrode) 31g which is electrically connected to the wiring layer 30g of the wiring board 30, and the lower ends of post electrodes (second post electrodes) 31ea, 31eb which are electrically connected to the wiring layers 30ea, 30eb arranged on the wiring board 30, are each in contact with the solder material 11.

That is, the lower ends of the post electrodes 31g, 31ea, 31eb face each other, with the solder material 11 intervening, on the gate electrode 10g and emitter electrodes 10ea, 10eb of the semiconductor element 10.

Similarly, above the semiconductor element 15, the lower ends of post electrodes (third post electrodes) 31aa, 31ab, electrically connected to wiring layers 30aa, 30ab arranged on the wiring board 30, face each other, with the solder material 16 intervening, on the anode 15a of the semiconductor electrode 15.

In the wiring layers 30g, 30ea, 30eb, 30aa, 30ab, electrical connections are made with electric circuits (not shown) formed on the main face of, or within the wiring board 30.

Here, the material of the wiring layers 30g, 30ea, 30eb, 30aa, 30ab, and the material of the post electrodes 31g, 31ea, 31eb, 31aa, 31ab has, for example, copper (Cu) as the main component.

The structure of the wiring board 30, used in the semiconductor device manufacturing method of the first aspect, is explained in detail using other drawings.

Figure 7A:
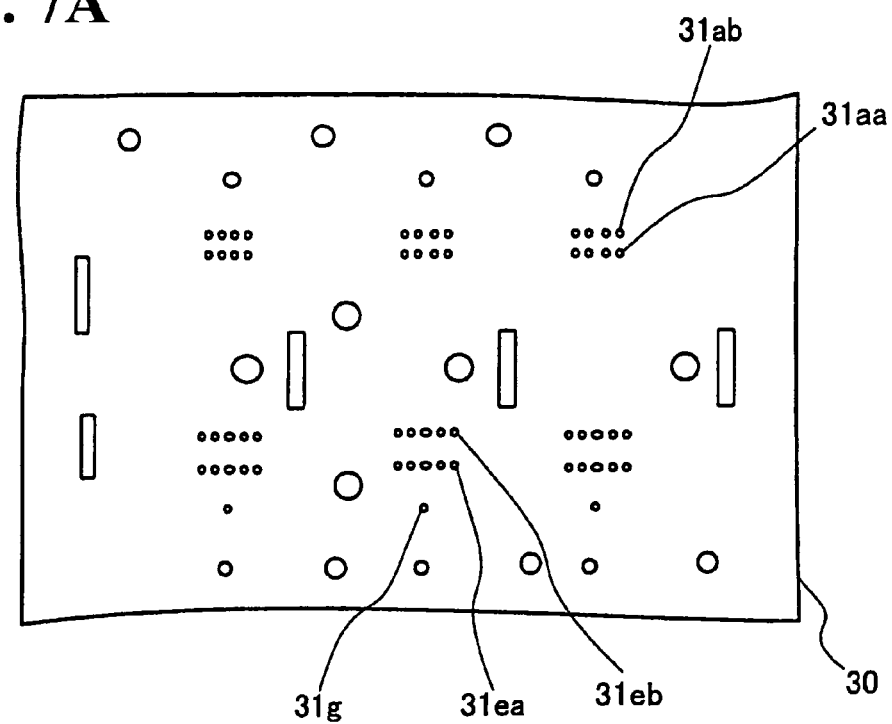
FIGS. 7A and 7B are sixth diagrams to explain the semiconductor device manufacturing method of the first aspect.
Figure 7B:
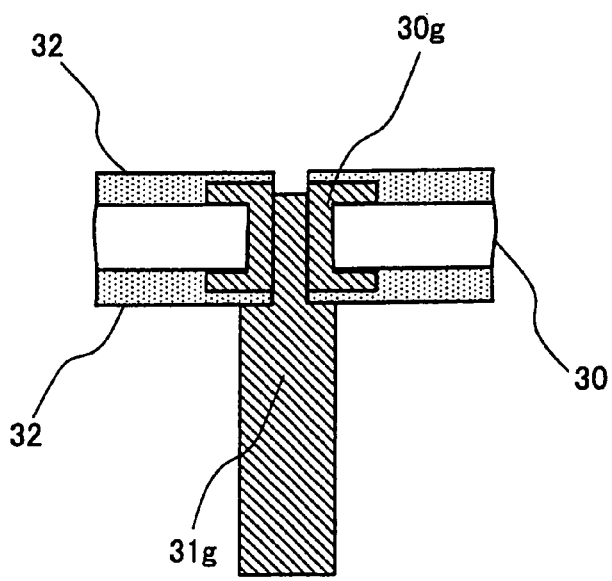

FIGS. 7A and 7B show the principal portions of the wiring board; FIG. 7A is a plan view of the upper face, and FIG. 7B shows an enlarged cross-sectional view of the vicinity of a post electrode. In FIG. 7B, as an example, the cross-section in the vicinity of the above-described post electrode 31g is shown.

This wiring board 30 is a board obtained by selectively placing in vertical alignment a plurality of post electrodes in prescribed positions on a so-called print board; for example, as shown in FIG. 7B, the post electrode 31g is injected (press-fitted) into the wiring board 30, and electrical connection is maintained between the wiring layer 30g selectively arranged on the wiring board 30 and the post electrode 31g.

In the wiring board 30, in addition to the post electrode 31g, post electrodes 31ea, 31eb, 31aa, 31ab are injected into the wiring board 30, as shown in FIG. 7A, and the wiring layers 30ea, 30eb, 30aa, 30ab arranged selectively on the wiring board 30 are electrically connected to the respective post electrodes 31ea, 31eb, 31aa, 31ab.

In bonding these post electrodes 31g, 31ea, 31eb, 31aa, 31ab and the wiring layers 30g, 30ea, 30eb, 30aa, 30ab, in addition to the above injection, soldering may be used. By this means, the electrical connection and mechanical strength of the post electrodes 31g, 31ea, 31eb, 31aa, 31ab with the wiring layers 30g, 30ea, 30eb, 30aa, 30ab are further increased.

The material of the wiring board 30 has as a main component, for example, a polyimide resin, epoxy resin, or similar. When necessary, glass cloth may be impregnated within the wiring board 30, to reinforce the strength of the wiring board 30.

Also, with respect to the rigidity of the wiring board 30, a hard type board exceeding a prescribed rigidity may be used, or a flexible type wiring board 30 which as a whole can be bent may be used.

On the surface of the wiring board 30 is formed a resin protective layer 32, as shown in FIG. 7B. In FIG. 7A, the protective layer 32 is not shown in order to clearly explain the arrangement of post electrodes.

On the wiring board 30, the post electrodes 31ea, 31eb and the post electrodes 31aa, 31ab are each arranged in five places in single horizontal rows. The pitches of the post electrodes are uniform. The post electrode 31g is arranged adjacent to the post electrodes 31ea.

And, as shown in FIG. 6, when the wiring board 30 is above and face the semiconductor element 10, the lower ends of the plurality of post electrodes 31ea, 31eb are arranged so as to be positioned above the emitter electrodes 10ea, 10eb of the semiconductor element 10. In this case, the lower end of the post electrode 31g is positioned above the gate electrode 10g of the semiconductor element 10.

Further, when the wiring board 30 is arranged above the semiconductor element 15, the lower ends of the plurality of post electrodes 31aa, 31ab are arranged so as to be positioned above the anode electrode 15a of the semiconductor element 15.

The number of the above-described post electrodes 31g, 31ea, 31eb, 31aa, 31ab is not limited to the number shown in FIGS. 7A and 7B. The number of post electrodes 31g, 31ea, 31eb, 31aa, 31ab may be varied according to the power capacities of the semiconductor elements 10 and 15. Further, the arrangement of the post electrodes 31ea, 31eb, 31aa, 31ab may be, in addition to the single horizontal rows shown in FIG. 7A, a zigzag arrangement.

The structures of the above-described post electrodes 31g, 31ea, 31eb, 31aa, 31ab are not limited to rod shapes, but may be pipe shapes, the interior of which is hollow. Also, the outer shapes of the post electrodes 31g, 31ea, 31eb, 31aa, 31ab may be cylindrical, or may have angles.

In the semiconductor device manufacturing method of the first aspect, a wiring board 30 with the structure described above is used.

Side faces of the wiring board 30 are fixed and supported by the above-described fastening jig in the process shown in FIG. 6. In FIG. 6, in order to simplify the configuration of the wiring board 30, the above-described protective layer 32 is not shown.

With respect to order, the wiring board 30 may be prepared prior to preparing the insulating board 23 and semiconductor elements 10 and 15.

Figure 8:
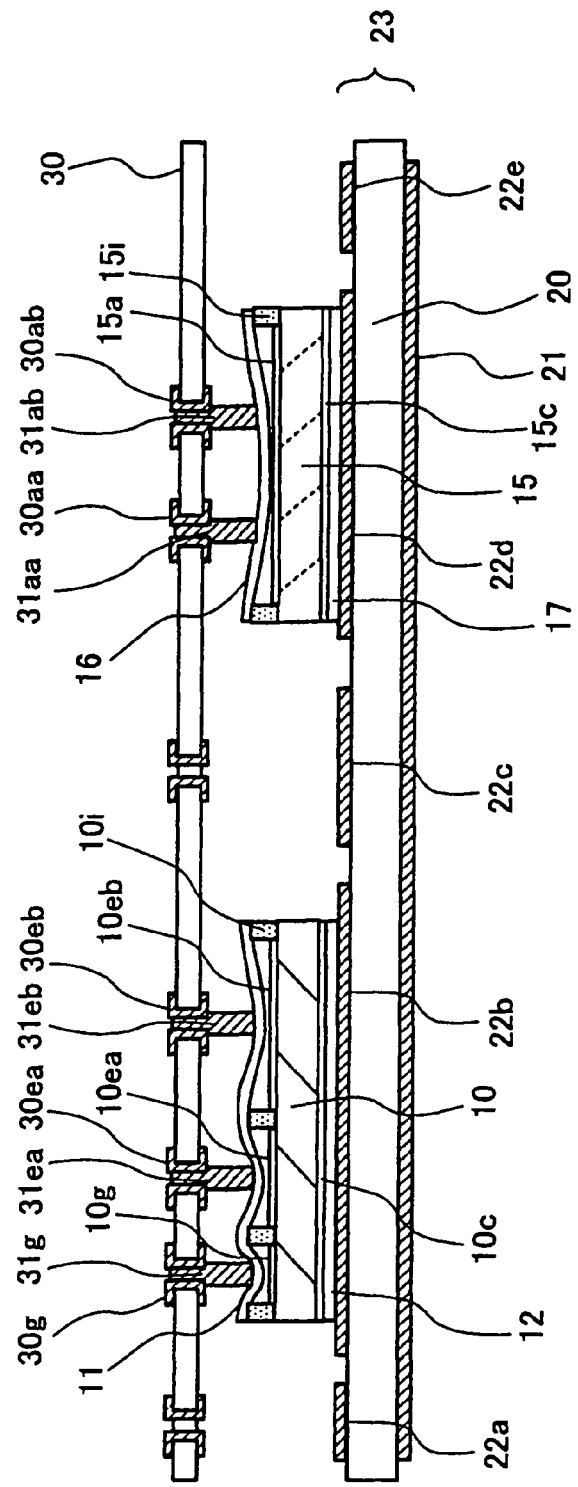
FIG. 8 is a seventh diagram to explain the semiconductor device manufacturing method of the first aspect.

Next, the semiconductor elements 10 and 15, wiring board 30 and similar are heated to the melting points of the solder materials 11, 12, 16, 17, or higher, to start reflow treatment of the solder materials 11, 12 and solder materials 16, 17. By means of this heating, the solder materials 11, 12 and solder materials 16, 17 begin to melt, as shown in FIG. 8. As a result, the rigidity of the solder materials 11, 16 is decreased, and the lower ends of the post electrodes 31g, 31ea, 31eb, 31aa, 31ab approach the semiconductor elements 10, 15.

Reflow treatment is performed using a vacuum reflow device, under reduced pressure or in an inert gas, hydrogen ($H_2$) gas, nitrogen ($N_2$) gas, or mixed hydrogen ($H_2$)/nitrogen ($N_2$) gas atmosphere. By this means, oxidation of the electrode surfaces of the semiconductor elements 10, 15 and of the post electrode surfaces during reflow treatment is prevented, and the molten solder materials 11, 12, 16, 17 can smoothly spread over the electrode surfaces and post electrode surfaces. Moreover, there is no occurrence of voids within the solder layers formed on the electrodes.

In order to improve wettability of the molten solder materials 11, 12, 16, 17 with respect to the electrode surfaces and post electrode surfaces, preprocessing may be performed prior to melting the solder materials 11, 12, 16, 17.

For example, the electrode surfaces and post electrode surfaces may be subjected to plasma treatment using an inert gas or nitrogen ($N_2$), to etch away approximately 1 to 2 nm of the electrode surfaces and the post electrode surfaces. Or, reduction treatment of the electrode surfaces and post electrode surfaces may be performed, in a hydrogen ($H_2$) environment at 270° C. or higher.

By this means, natural oxidation films on the electrode surfaces and post electrode surfaces, as well as nickel (Ni) oxides which have precipitated and grown on electrode surfaces, are removed, and the wettability of the molten solder materials 11, 12, 16, 17 with respect to the electrode surfaces and post electrode surfaces is improved.

Figure 9:
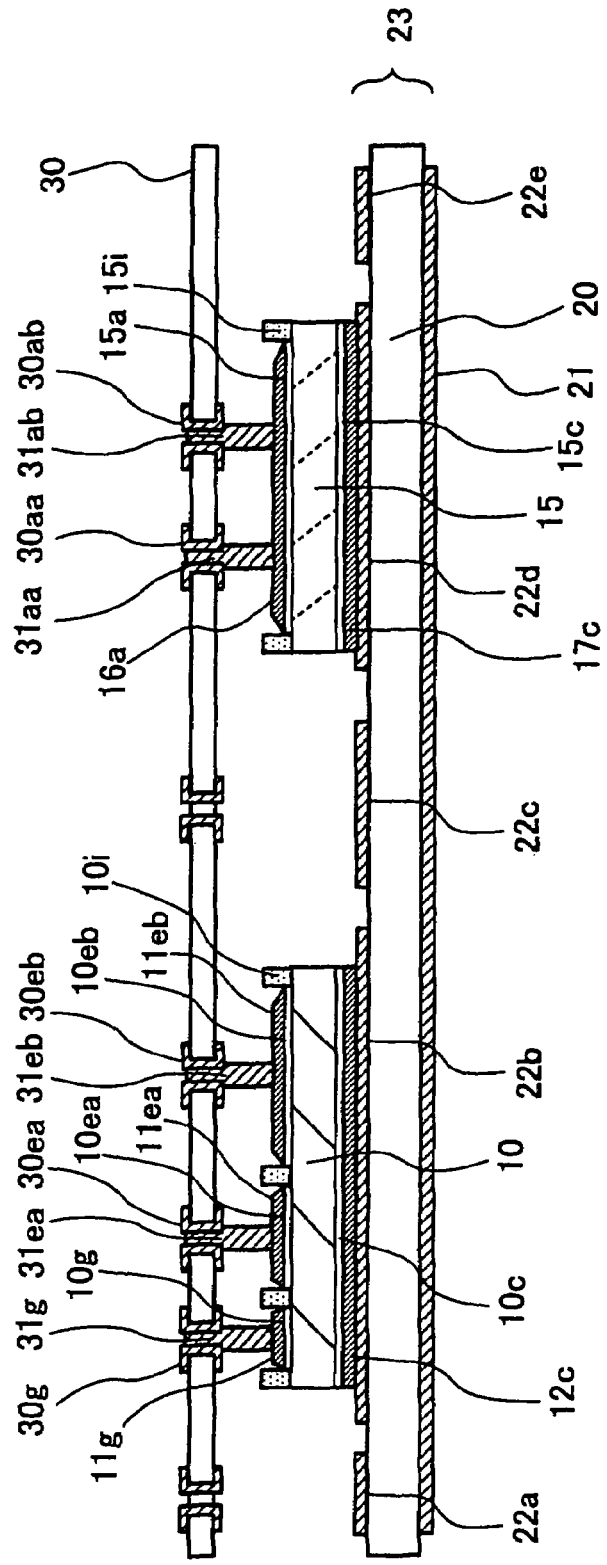
FIG. 9 is an eighth diagram to explain the semiconductor device manufacturing method of the first aspect

And, when reflow treatment is performed for a length of time, the solder material 11 is completely separated with the insulating layer 10i interposed, as shown in FIG. 9.

That is, a solder layer (first conductive bonding layer) 11g is formed only on the gate electrode 10g, and solder layers (second conductive bonding layers) 11ea, 11eb are formed only on the respective emitter electrodes 10ea, 10eb. Also, a solder layer (fourth conductive bonding layer) 16a is formed on the anode 15a.

And, the post electrode 31g and gate electrode 10g are electrically connected via the solder layer 11g. Also, the post electrodes 31ea, 31eb and emitter electrodes 10ea, 10eb are electrically connected via the solder layers 11ea, 11eb. And, the post electrodes 31aa, 31ab and anode 15a are electrically connected via the solder layer 16a.

The collector electrode 10c of the semiconductor element 10 and the metal foil 22b are electrically connected via the solder layer (third conductive bonding layer) 12c, and the cathode 15c of the semiconductor element 15 and metal foil 22d are electrically connected via the solder layer (fifth conductive bonding layer) 17c.

Here, a supplementary explanation of the wettability of solder material with respect to a metal surface or polyimide material is given. In order to identify differences in wettability of solder material with respect to metal surfaces or polyimide material, examples of the contact angle of solder material with metal surfaces and polyimide material are provided.

Figure 10A:
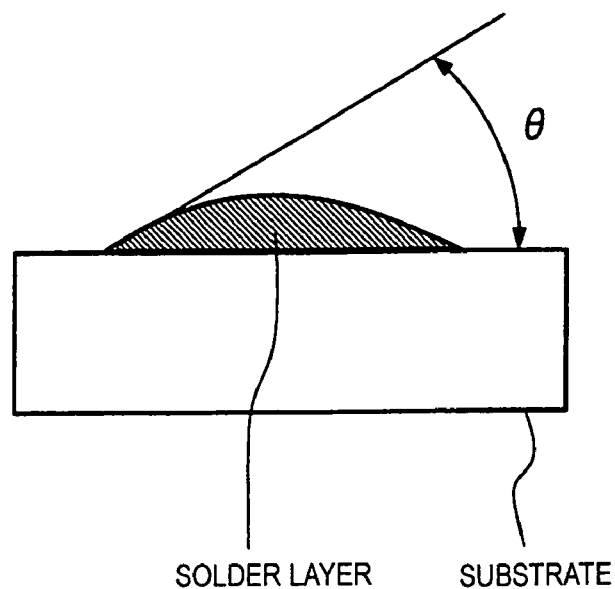
FIGS. 10A and 10B are ninth diagrams to explain the semiconductor device manufacturing method of the first aspect.
Figure 10B:
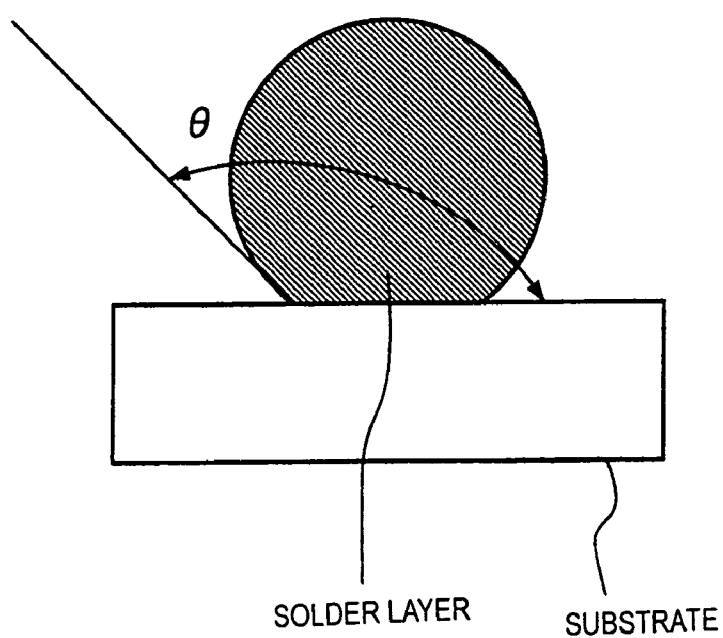

For example, as shown in FIG. 10A, within the range of contact angles $\theta$ of $0<\theta\leq 90°$ when a solder layer makes contact with a metal or polyimide substrate, the solder layer is in a state of immersional wetting of the substrate. And as shown in FIG. 10B, in the range of contact angles $\theta$ of $90°<\theta\leq 180°$, the solder layer is in a state of adhesional wetting of the substrate. In the case of $\theta=0°$ (not shown), the solder layer is in a state of spreading wetting of the substrate.

That is, the smaller the contact angle, the better (higher) is the wettability of the solder layer with respect to the substrate, and the larger the contact angle, the poorer (lower) is the wettability of the solder layer with respect to the substrate.

FIG. 11 shows examples of measured contact angles for solder material with metal surfaces and polyimide material. Here, the contact angle $\theta$ is measured using a contact angle measurement instrument (Kyowa Interface Science model CA-X). The contact angle $\theta$ of the solder layer with the metal surface or polyimide material is measured after the reflow treatment.

As the substrates with which the solder layer makes contact, three types including the emitter electrode surface of a commercially marketed IGBT element, a copper (Cu) sheet formed on an alumina ($Al_2O_3$) sheet, and a polyimide film which is a substitute for the insulating layer 10i of an IGBT element are employed. Here, the material of the IGBT element emitter electrode is aluminum (Al), with nickel (Ni)/gold (Au) plating performed from the lower layer. Hence measurement of the contact angle on the emitter electrode is measurement of the contact angle of the solder material on a gold (Au) film.

The material of the post electrodes has copper (Cu) as the main component, as explained above. Hence by measuring the contact angle of the solder material on the copper (Cu) sheet, the wettability of the solder material with respect to the post electrodes can also be determined.

On the copper (Cu) sheet surface, nitrogen ($N_2$) gas plasma processing (400 W, 3 minutes) is performed as preprocessing to remove the natural oxidation film.

The reflow temperature is 340° C. for lead (Pb)-free solder, and is 200° C. for lead (Pb)-containing solder.

As shown in the figures, on the Al/Ni/Au electrode surface, the contact angle $\theta$ is 10° or less, regardless of whether lead (Pb)-free solder or lead (Pb)-containing solder is used.

On the copper (Cu) sheet, the contact angle $\theta$ for lead (Pb)-free solder is 60° or less, while the contact angle $\theta$ for lead (Pb)-containing solder is 9° or less.

On the polyimide film, the contact angle $\theta$ is 80° or greater regardless of whether lead (Pb)-free solder or lead (Pb)-containing solder is used. The contact angle $\theta$ for water and polyimide film is approximately 100°, so that the contact angle of the solder material with the polyimide film material is approximately the same as that with water.

The gate electrode of the semiconductor element is of the same material as the emitter electrodes, so that the contact angle of the solder material with the gate electrode surface is the same as for the emitter electrodes.

Due to these differences in contact angle $\theta$ of the solder material with electrode surfaces and with polyimide material, the solder material does not wet the insulating layer 10i, but is separated with the insulating layer 10i interposed, so that solder layers 11g, 11ea, 11eb are formed on only the gate electrode 10g, or on only the emitter electrodes 10ea and 10eb, of the semiconductor element 10.

In other words, because the contact angle of the solder material with the insulating layer 10i is greater than the contact angles of the solder material with the gate electrode 10g or with the emitter electrodes 10ea and 10eb, the solder material is separated with the insulating layer 10i interposed.

Further, the height and line width of the insulating layer 10i separating the solder material 11 are adjusted if necessary, as described below.

For example, as a first method, a semiconductor element 10 is used on which an insulating layer 10i is placed with height higher than the highest solder layer among the solder layers 11g, 11ea, 11eb shown in FIG. 9.

If such an insulating layer 10i is formed on the semiconductor element 10, then due to the poorness of wetting of the solder material with respect to the insulating layer 10i, the surface tension of the solder material, and the weight of the solder material itself, the solder material 11 will reliably be separated from the insulating layer 10i interposed. That is, solder layers 11g, 11ea, 11eb are formed on only the gate electrode 10g, or on only the emitter electrodes 10ea, 10eb.

When there are variations in the heights of the plurality of post electrodes 31g, 31ea, 31eb protruding from the lower face of the wiring board 30, and the difference in the heights between the lowest post electrode and the highest post electrode is 50 μm or greater, the heights of the solder layers 11g, 11ea, 11eb must be made 50 μm or higher. By this means, all of the post electrodes 31g, 31ea, 31eb are bonded to the gate electrode 10g and emitter electrodes 10ea, 10eb via the solder layers 11g, 11ea, 11eb.

In this case, as a second method, a semiconductor element 10 having an insulating layer 10i of height 50 μm or greater is used.

By forming such an insulating layer 10i on the semiconductor element 10, due to the poorness of (low) wetting of the solder material with respect to the insulating layer 10i, the surface tension of the solder material, and the weight of the solder material itself, the solder material 11 will reliably be separated with the insulating layer 10i interposed. That is, solder layers 11g, 11ea, 11eb are formed on only the gate electrode 10g, or on only the emitter electrodes 10ea, 10eb.

When the difference in heights between the lowest post electrode and the highest post electrode is less than 50 μm (for example, from 10 μm to 50 μm), the heights of the solder layers 11g, 11ea, 11eb need only to be equal to or greater than this difference. By this means, all of the post electrodes 31g, 31ea, 31eb are bonded to the gate electrode 10g and the emitter electrodes 10ea, 10eb via the solder layers 11g, 11ea, 11eb.

And, in this case, as a third method a semiconductor element 10 provided with an insulating layer 10i of thickness equal to or above this difference is used.

If such an insulating layer 10i is formed on the semiconductor element 10, due to the low wetting of the solder material with respect to the insulating layer 10i, the surface tension of the solder material, and the weight of the solder material itself, the solder material 11 will reliably be separated, with the insulating layer 10i interposed. That is, solder layers 11g, 11ea, 11eb are formed on only the gate electrode 10g, or on only the emitter electrodes 10ea, 10eb.

And, as a fourth method, when there is no variation at all among the post electrodes, the height of the insulating layer 10i of the semiconductor element 10 may be such that solder material is repelled, without affecting the poorness of wetting of the solder material with respect to the insulating layer 10i. Specifically, the lower limit to the height of the insulating layer 10i is set at 0.1 μm.

A thin insulating layer 10i results in reliable separation of the solder material 11 with the insulating layer 10i interposed, due to the poor wetting of the solder material with respect to the insulating layer 10i and the surface tension of the solder material. That is, solder layers 11g, 11ea, 11eb are formed on only the gate electrode 10g, or on only the emitter electrodes 10ea, 10eb.

The height of the insulating layer 15i placed on the semiconductor element 15 needs only to be sufficient that the solder layer 16a does not fall from the anode 15a of the semiconductor element 15. Specifically, the lower limit to the height of the insulating layer 15i is set to 0.1 μm.

Further, as explained above, the upper limit to the height of the insulating layers 10i and 15i is set such that the insulating layers 10i, 15i do not make contact with the main face of the wiring board 30. For example, the upper limit to the height of the insulating layer 10i is set to approximately the gap between the semiconductor element 10 and the wiring board 30 (from 500 μm to 2 mm).

Further, the line width of the insulating layer 10i is set to 200 μm or greater for the reasons given above.

As shown in FIG. 9, the insulating board 23 and wiring board 30 are fixed and supported in their positions by a fastening jig, as explained above, so that during the reflow treatment, there is no movement in a horizontal direction (in a direction parallel to the respective main faces of the insulating board 23 and wiring board 30) of the metal foils 22b or 22d or the post electrodes 31g, 31ea, 31eb, 31aa, 31ab.

Further, a plurality of the post electrodes 31ea, 31eb, 31aa, 31ab is arranged with a uniform pitch as explained above. By this means, the solder layers 11ea, 11eb, 16aa, 16ab uniformly wet and spread to the post electrodes during reflow treatment. Hence a self-alignment effect is promoted at the semiconductor elements 10, 15 contacting the solder layers 11ea, 11eb, 16aa, 16ab.

By this means, there are no shifts in the positions of the semiconductor elements 10, 15 on the metal foils 22b, 22d during reflow treatment.

Figure 12:
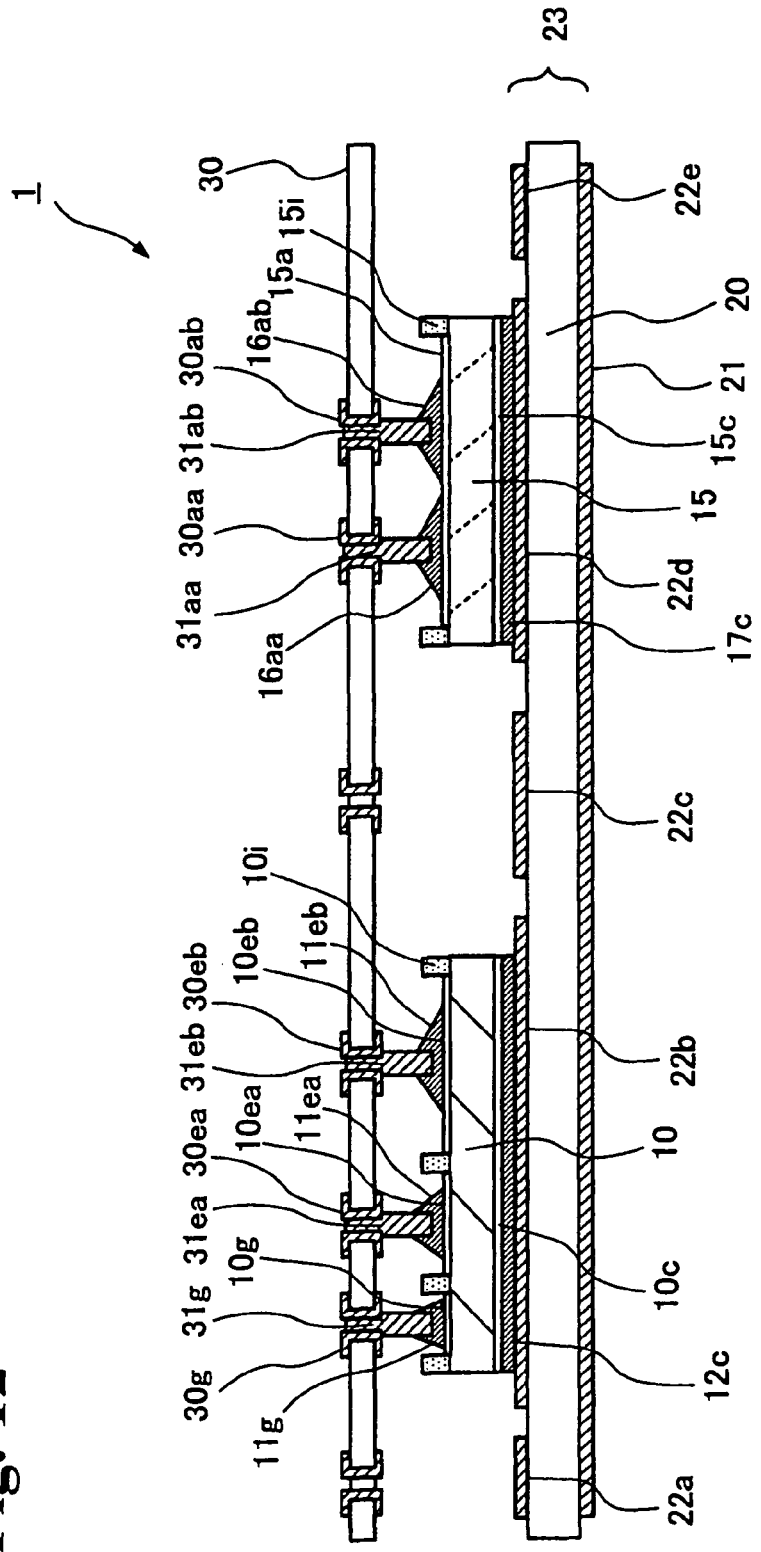
FIG. 12 is an eleventh diagram to explain the semiconductor device manufacturing method of the first aspect.

Further, if reflow treatment is continued for a prescribed length of time, the result shown in FIG. 12 is obtained.

As shown in the figure, the solder layers 11g, 11ea, 11eb, 16aa, 16ab spread and wet up to the side faces of the post electrodes 31g, 31ea, 31eb, 31aa, 31ab, and the solder layers 11g, 11ea, 11eb, 16aa, 16ab form fillets.

This is due to the fact that the materials of the post electrodes 31g, 31ea, 31eb, 31aa, 31ab comprise copper (Cu) and as explained above, the solder layers have good wettability with respect to the post electrodes.

That is, because the contact angles of the solder layers with the insulating layers 10i, 15i are greater than the contact angles of the solder layers with the post electrodes 31ea, 31eb, 31aa, 31ab, even though the reflow treatment is continued, the solder layers do not wet and spread onto the insulating layers 10i, 15i.

By this means, the solder layers 11g, 11ea, 11eb, 16aa, 16ab wet and spread on only the gate electrode 10g and the emitter electrodes 10ea and 10eb of the semiconductor element 10, the anode 15a of the semiconductor element 15, and the post electrodes 31g, 31ea, 31eb, 31aa, 31ab.

After formation of the fillets, the reflow treatment is halted, and the fastening jig is removed. Then, molding is performed to fill the gap between the insulating board 23 and the wiring board 30 with a sealing resin (not shown), comprising, for example, epoxy resin or similar. By this means, the semiconductor elements 10, 15 and the post electrodes 31g, 31ea, 31eb, 31aa, 31ab, and similar are sealed with sealing resin.

Bonding of the collector electrode 10c and the metal foil 22b, and bonding of the cathode 15c and the metal foil 22d, may be performed by crimping or by ultrasonic bonding instead of soldering.

By means of this manufacturing method, the semiconductor device 1 shown is completed. The semiconductor device 1 may also be packaged using a PPS (polyphenylene sulfide) or other resin case, to form a general-use power module.

In the semiconductor device 1, a metal base plate having a thickness of several millimeters and broader in area than the insulating board 23 may be used as the base of the semiconductor device 1. By providing such a metal base plate, heat dissipation of the semiconductor device 1 is further improved.

Further, an IC circuit portion, capacitors, resistors, and other electronic components may be provided on the above-described wiring board 30. By this means the semiconductor device 1 can be made to function as a compact and thin intelligent power module, with a temperature sensor circuit, overvoltage/overcurrent protection circuit, and similar incorporated.

Figure 13A:
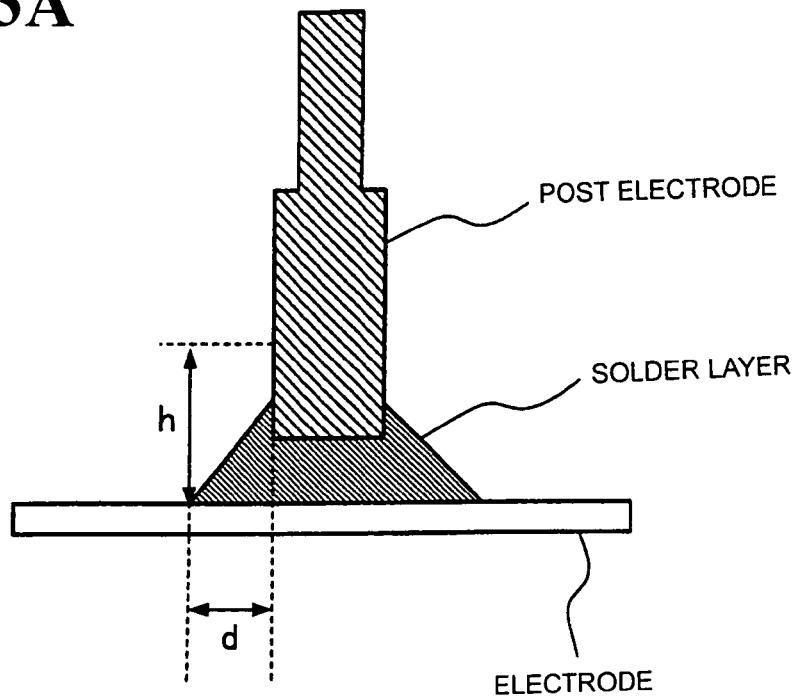
FIGS. 13A and 13B are twelfth diagrams to explain the semiconductor device manufacturing method of the first aspect.
Figure 13B:
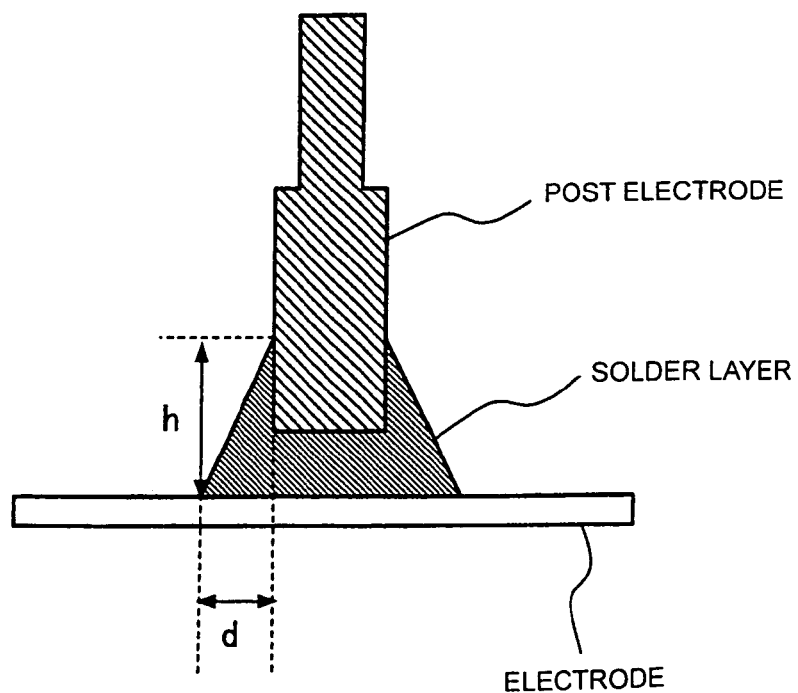

FIGS. 13A and 13B are enlarged diagrams of the solder layer fillet shape.

In this fillet shape, if the distance from the outermost periphery at which the solder layer touches the electrode to the post electrode side face is d, and the height of the solder layer is h, then it is preferable that h be in the range from the state in which h and d are equal, as in FIG. 13A, to the state in which h is twice d, as shown in FIG. 13B. That is, a shape is formed such that h and d are related by $d \leq h \leq 2d$. Here it is preferable that d be from 125 μm to 250 μm. By this means, the area of bonding of the electrode with the post electrode is increased, and the resistance of the L component of the conduction path can be reduced. Moreover, bonding strength between the post electrode and the electrode is increased. And, the mechanical strength of the post electrode is increased.

In this way, in the semiconductor device manufacturing method of the first aspect, the materials of the solder materials 11 and 16 and of the insulating layers 10i and 15i, the shapes of the solder materials 11 and 16 and of the insulating layers 10i and 15i, and the reflow treatment, are adjusted to the optimal conditions.

For example, utilizing the difference in wettability of the solder material 11 with respect to the electrode surfaces and insulating layer 10i, the surface tension of the solder material 11, and the weight of the solder material 11 itself, the solder material 11 is separated over each of the electrodes with the insulating layer 10i interposed. Then, the amounts and shapes of the solder layers positioned on each of the electrodes are adjusted.

By this means, even when there is variation in the heights of the post electrodes, all of the post electrodes can be electrically connected with reliability to the semiconductor element electrodes via the solder layers. These solder layers are separated reliably with the insulating layers provided on the semiconductor elements interposed, so that short-circuits between electrodes of the semiconductor element do not occur.

Further, because the solder materials 11, 16 do not contain a flux component, after bonding of post electrodes and electrodes, there is no need for flux cleaning of the electrode surfaces.

Also, because the solder materials 11, 16 are in sheet form and do not contain the flux, during the reflow treatment there is no scattering of a flux component or of solder material in the vicinity of the semiconductor elements 10, 15.

Further, the solder materials 11 and 16 are in sheet form, and alignment with the semiconductor elements 10, 15 is easy. And, the solder materials 11, 16 merely face and are positioned above the semiconductor elements 10, 15, so that there are no shifts in position of the semiconductor elements 10, 15 during manufacturing processes.

With respect to the solder layer fillet shapes, if the distance from the outermost periphery at which the solder layer touches the electrode to the post electrode side face is d, and the height of the solder layer is h, then because the solder layer and electrode are bonded such that $d \leq h \leq 2d$, the bonding area is equal to or greater than the area of bonding of a conventional bonding wire with the electrode. Hence the rated currents of the semiconductor elements 10, 15 can be passed via the post electrodes and the fillet portions.

Consequently, the heat generated when large currents are passed through the semiconductor elements 10, 15 is dispersed by the respective post electrodes and fillet portions, so that there is no deformation due to thermal expansion of the post electrodes or wiring board.

It is also confirmed that service lifetimes are different for the semiconductor device 1 and for a semiconductor device which employs aluminum (Al) bonding wires instead of the post electrodes 31g, 31ea, 31eb, 31aa, 31ab of the semiconductor device 1.

Specifically, in power cycle tests with a temperature rise/drop of $\Delta Tj=125°$ C., the lifetime of the latter semiconductor device is approximately 200,000 cycles, indicating inadequate characteristics, whereas the lifetime of semiconductor device 1 is approximately 500,000 cycles, which is normal.

Further, a plurality of post electrodes is bonded to electrodes at one time via solder layers, so that compared with wire bonding processes, the time required by manufacturing processes can be greatly reduced.

By this means, a semiconductor device having high reliability and excellent operating characteristics, as well as good productivity, and a method of manufacture of such semiconductor devices, are realized.

In this way, by means of the semiconductor device manufacturing method of the first aspect, semiconductor devices with high reliability and having excellent operating characteristics can be manufactured with high production yields.

Second Embodiment

Next, the specific manufacturing method of the semiconductor device manufacturing method of a second aspect is explained, using FIG. 14 to FIG. 19. In all of the drawings described below, members which are the same as in the above FIG. 2A to FIG. 13B are assigned with the same symbols, and detailed explanations are omitted.

FIG. 14 to FIG. 19 are drawings to explain the semiconductor device manufacturing method of the second aspect.

Figure 14:
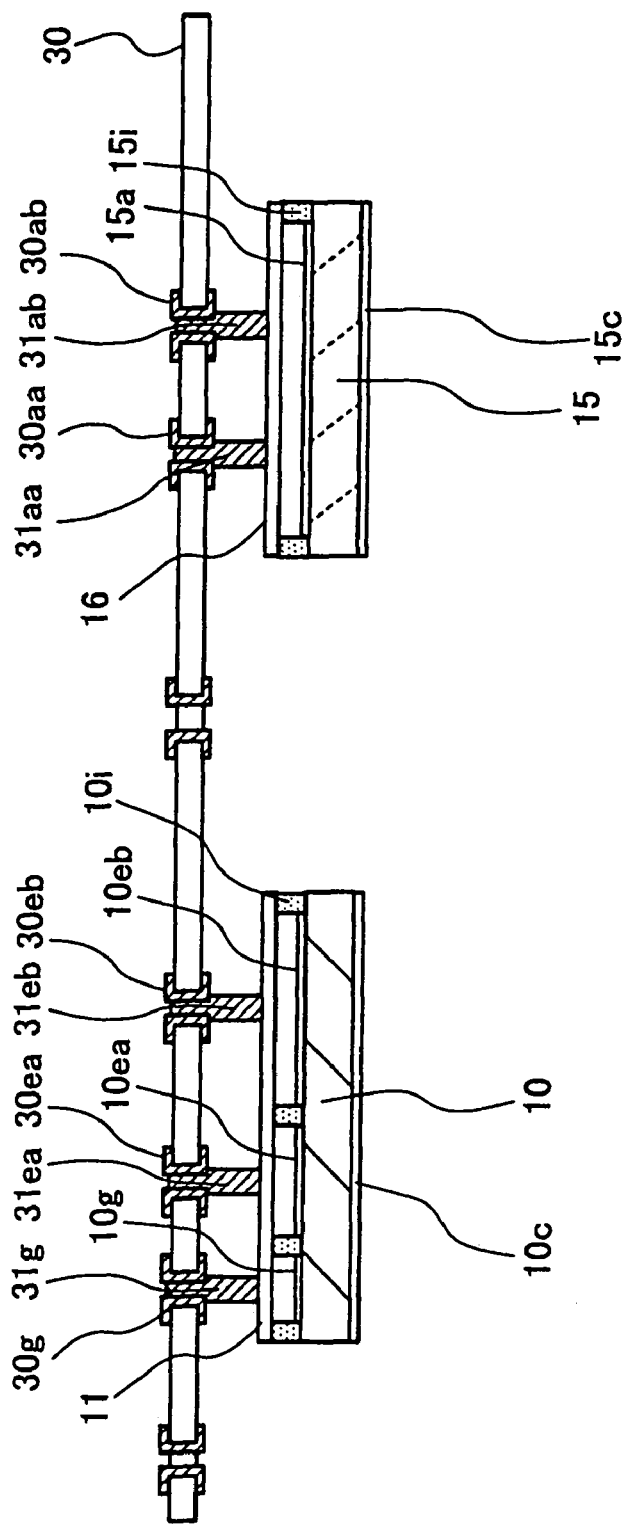
FIG. 14 is a first diagram to explain the semiconductor device manufacturing method of a second aspect.

First, as shown in FIG. 14, semiconductor elements 10, 15 are prepared. These semiconductor elements 10, 15 are fastened and supported by a carbon fastening jig (not shown).

Then, solder material in sheet form (first conductive bonding material) 11 is supported by the insulating layer 10i arranged on the upper-face side of the semiconductor element 10, and the main face of the solder material 11 face the gate electrode 10g and the emitter electrodes 10ea, 10eb. Similarly, the sheet-shape solder material 16 is supported by the insulating layer 15i arranged on the upper-face side of the semiconductor element 15, and the main face of the solder material 16 face the anode 15a of the semiconductor element 15.

The thicknesses of the solder materials 11, 16 used in this stage are, as explained above, from 50 μm to 150 μm. And, the planar sizes of the solder materials 11, 16 are sizes same as the main faces of the respective semiconductor elements 10, 15. By this means, alignment of the solder materials 11, 16 with the semiconductor elements 10, 15 is facilitated.

Moreover, solder materials 11 and 16 which are somewhat smaller in size than the main faces of the semiconductor elements 10 and 15 may be used. For example, solder materials 11 and 16 which are from 60% to 100% of the area of the main faces of the semiconductor elements 10 and 15 may be used. However, the sizes must be such that the edges of the solder materials 11 and 16 are securely supported by the insulating layers 10i, 15i formed on the outer peripheries of the semiconductor elements 10 and 15.

Next, the wiring board 30 is prepared. A wiring pattern is selectively arranged on this wiring board 30. And, the lower end of the post electrode 31g which is electrically connected to the wiring layer 30g of the wiring board 30, and the lower ends of the post electrodes 31ea and 31eb which are electrically connected to the wiring layers 30ea and 30eb of the wiring board 30, are brought into contact with the solder material 11.

That is, the lower ends of the post electrodes 31g, 31ea, 31eb face, with the solder material 11 intervening, the gate electrode 10g and the emitter electrodes 10ea, 10eb of the semiconductor element 10.

Similarly, the lower ends of the post electrodes 31aa, 31ab which are electrically connected to the wiring layers 30aa, 30ab arranged on the wiring board 30 face the anode 15a of the semiconductor element 15, with the solder material 16 intervening.

By this means, over the semiconductor element 10, the lower ends of a plurality of post electrodes 31ea, 31eb are arranged so as to be positioned above the emitter electrodes 10ea, 10eb of the semiconductor element 10. And, the lower end of the post electrode 31g is positioned above the gate electrode 10g of the semiconductor element 10.

Also, over the semiconductor element 15 the lower ends of the plurality of post electrodes 31aa, 31ab are arranged so as to be positioned above the anode 15a of the semiconductor element 15.

Figure 15:
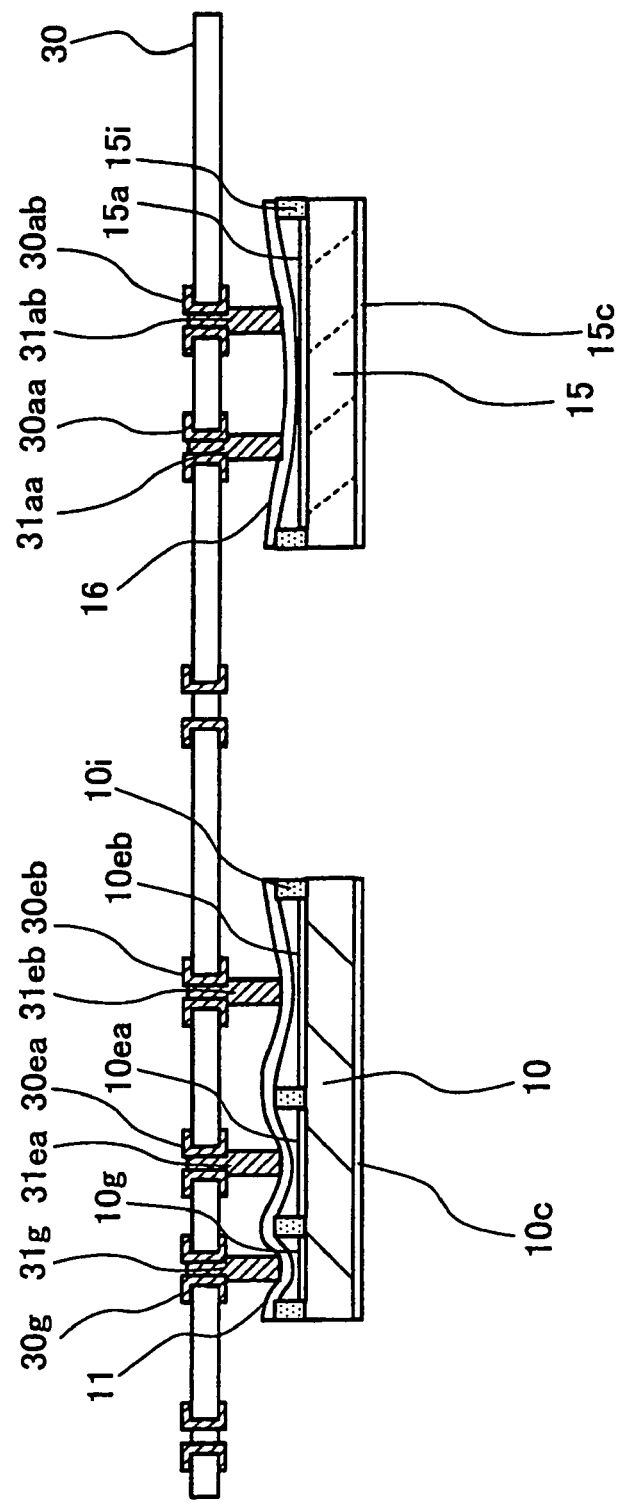
FIG. 15 is a second diagram to explain the semiconductor device manufacturing method of the second aspect.

Next, the semiconductor elements 10, 15, wiring board 30, and similar are heated to at least the melting point of the solder materials 11, 16, and the reflow treatment of the solder materials 11, 16 is begun. By means of this heating, the solder materials 11, 16 begin to melt, as shown in FIG. 15. As a result, the rigidity of the solder materials 11, 16 is decreased, and the lower ends of the post electrodes 31g, 31ea, 31eb, 31aa, 31ab approach the semiconductor elements 10, 15.

The reflow treatment is performed using a vacuum reflow device, under reduced pressure or in an inert gas, hydrogen ($H_2$) gas, nitrogen ($N_2$) gas, or mixed hydrogen ($H_2$)/nitrogen ($N_2$) gas atmosphere. By this means, oxidation of the electrode surfaces of the semiconductor elements 10, 15 and of the post electrode surfaces during reflow treatment is prevented, and the molten solder materials 11, 16 are smoothly spread and wet the electrode surfaces and post electrode surfaces. Moreover, there is no occurrence of voids within the solder layers formed on the electrodes.

In order to improve wettability of the molten solder materials 11, 16 with respect to the electrode surfaces and post electrode surfaces, preprocessing may be performed prior to melting the solder materials 11, 16.

For example, the electrode surfaces and post electrode surfaces may be subjected to plasma treatment using an inert gas or nitrogen ($N_2$), to etch away approximately 1 to 2 nm of the electrode surfaces and the post electrode surfaces. Or, reduction treatment of the electrode surfaces and post electrode surfaces may be performed, in a hydrogen ($H_2$) environment at 270° C. or higher.

By this means, natural oxidation films on the electrode surfaces and post electrode surfaces, as well as nickel (Ni) oxides which have precipitated and grown on electrode surfaces, are removed, and the wettability of the molten solder materials 11 and 16 with respect to the electrode surfaces and post electrode surfaces is improved.

Figure 16:
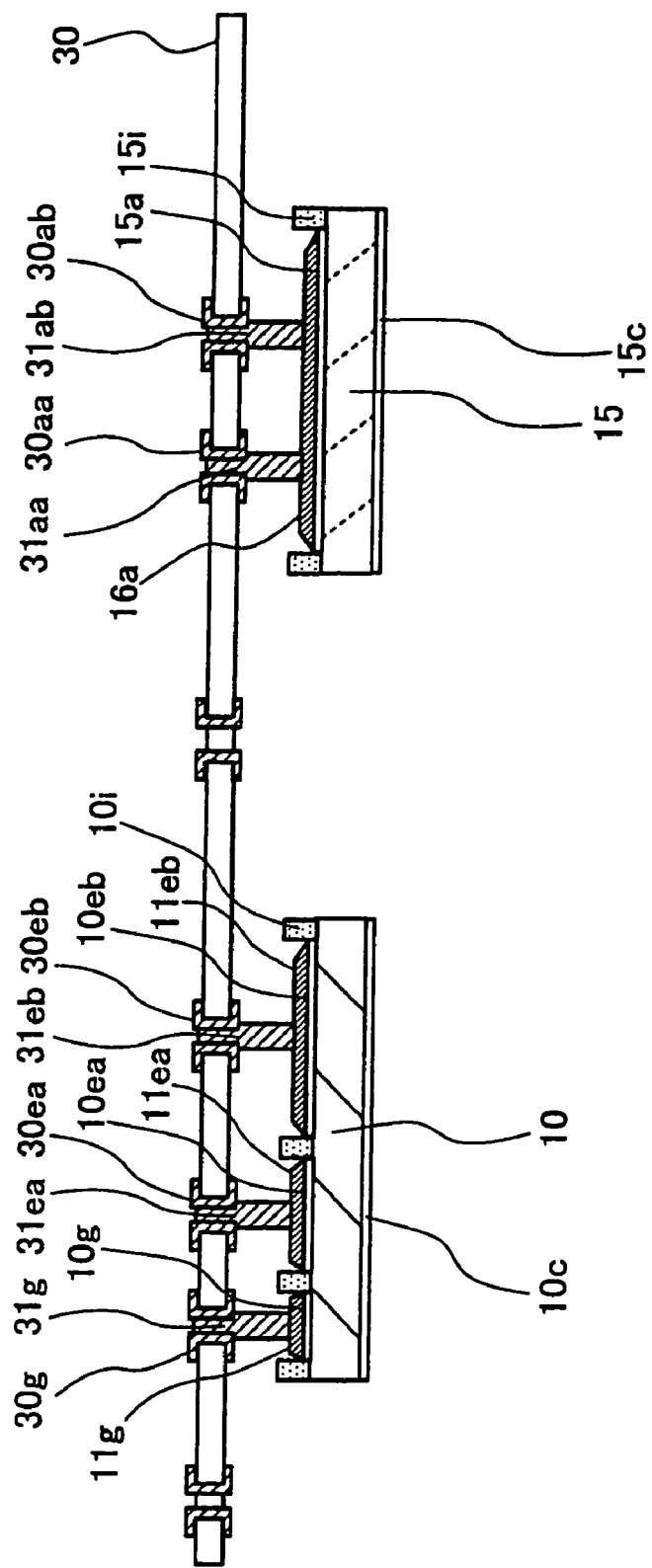
FIG. 16 is a third diagram to explain the semiconductor device manufacturing method of the second aspect.

And, when reflow treatment is performed for a length of time, the solder material 11 is completely separated with the insulating layer 10i interposed, as shown in FIG. 16.

That is, a solder layer 11g is formed only on the gate electrode 10g, and solder layers 11ea, 11eb are formed only on the respective emitter electrodes 10ea, 10eb. Also, a solder layer 16a is formed on the anode 15a.

And, the post electrode 31g and gate electrode 10g are electrically connected via the solder layer 11g. Also, the post electrodes 31ea, 31eb and emitter electrodes 10ea, 10eb are electrically connected via the solder layers 11ea, 11eb. And, the post electrodes 31aa, 31ab and anode 15a are electrically connected via the solder layer 16a.

The height and line width of the insulating layer 10i separating the solder material 11 are adjusted similarly to the method used in the semiconductor device manufacturing method of the first aspect.

For example, as a first method, a semiconductor element 10 is used on which an insulating layer 10i is placed with height higher than the highest solder layer among the solder layers 11g, 11ea, 11eb shown in FIG. 16.

If such an insulating layer 10i is formed on the semiconductor element 10, then due to the poorness of wetting of the solder material with respect to the insulating layer 10i, the surface tension of the solder material, and the weight of the solder material itself, the solder material 11 will reliably be separated with the insulating layer 10i interposed. That is, solder layers 11g, 11ea, 11eb are formed on only the gate electrode 10g, or on only the emitter electrodes 10ea, 10eb.

When there is variation in the heights of the plurality of post electrodes 31g, 31ea, 31eb protruding from the lower face of the wiring board 30, and the difference in the heights of the lowest post electrode and the highest post electrode is 50 μm or greater, the heights of the solder layers 11g, 11ea, 11eb must be made 50 μm or higher. By this means, all of the post electrodes 31g, 31ea, 31eb are bonded to the gate electrode 10g and emitter electrodes 10ea, 10eb via the solder layers 11g, 11ea, 11eb.

In this case, as a second method, a semiconductor element 10 having an insulating layer 10i of height 50 μm or greater is used.

By forming such an insulating layer 10i on the semiconductor element 10, due to the poorness of wetting of the solder material with respect to the insulating layer 10i, the surface tension of the solder material, and the weight of the solder material itself, the solder material 11 will reliably be separated with the insulating layer 10i interposed. That is, solder layers 11g, 11ea, 11eb are formed on only the gate electrode 10g, or on only the emitter electrodes 10ea, 10eb.

When the difference in heights of the lowest post electrode and the highest post electrode is less than 50 μm (for example, from 10 μm to 50 μm), the heights of the solder layers 11g, 11ea, 11eb need only to be equal to or greater than this difference. By this means, all of the post electrodes 31g, 31ea, 31eb are bonded to the gate electrode 10g and the emitter electrodes 11ea, 10eb via the solder layers 11g, 11ea, 11eb.

And, in this case, as a third method, a semiconductor element 10 provided with an insulating layer 10i of thickness equal to or above this difference is used.

If such an insulating layer 10i is formed on the semiconductor element 10, due to the poorness of wetting of the solder material with respect to the insulating layer 10i, the surface tension of the solder material, and the weight of the solder material itself, the solder material 11 will reliably be separated with the insulating layer 10i interposed. That is, solder layers 11g, 11ea, 11eb are formed on only the gate electrode 10g, or on only the emitter electrodes 10ea, 10eb.

And, as a fourth method, when there is no variation at all among the post electrodes, the height of the insulating layer 10i of the semiconductor element 10 may be such that solder material is repelled, without affecting the poorness of wetting of the solder material with respect to the insulating layer 10i. Specifically, the lower limit to the height of the insulating layer 10i is set to 0.1 μm.

Even such a thin insulating layer 10i results in reliable separation of the solder material 11 with the insulating layer 10i interposed, due to the poor wetting of the solder material with respect to the insulating layer 10i and the surface tension of the solder material. That is, solder layers 11g, 11ea, 11eb are formed on only the gate electrode 10g, or on only the emitter electrodes 10ea, 10eb.

The height of the insulating layer 15i placed on the semiconductor element 15 needs only to be sufficient so that the solder layer 16a does not fall from the anode 15a of the semiconductor element 15. Specifically, the lower limit to the height of the insulating layer 15i is set to 0.1 μm.

Further, as explained above, the upper limit to the height of the insulating layers 10i and 15i is set such that the insulating layers 10i, 15i do not contact the main face of the wiring board 30. For example, the upper limit to the height of the insulating layer 10i is set to approximately the gap between the semiconductor element 10 and the wiring board 30 (from 500 μm to 2 mm).

Further, the line width of the insulating layer 10i is set to 200 μm or greater for the reasons given above.

Figure 17:
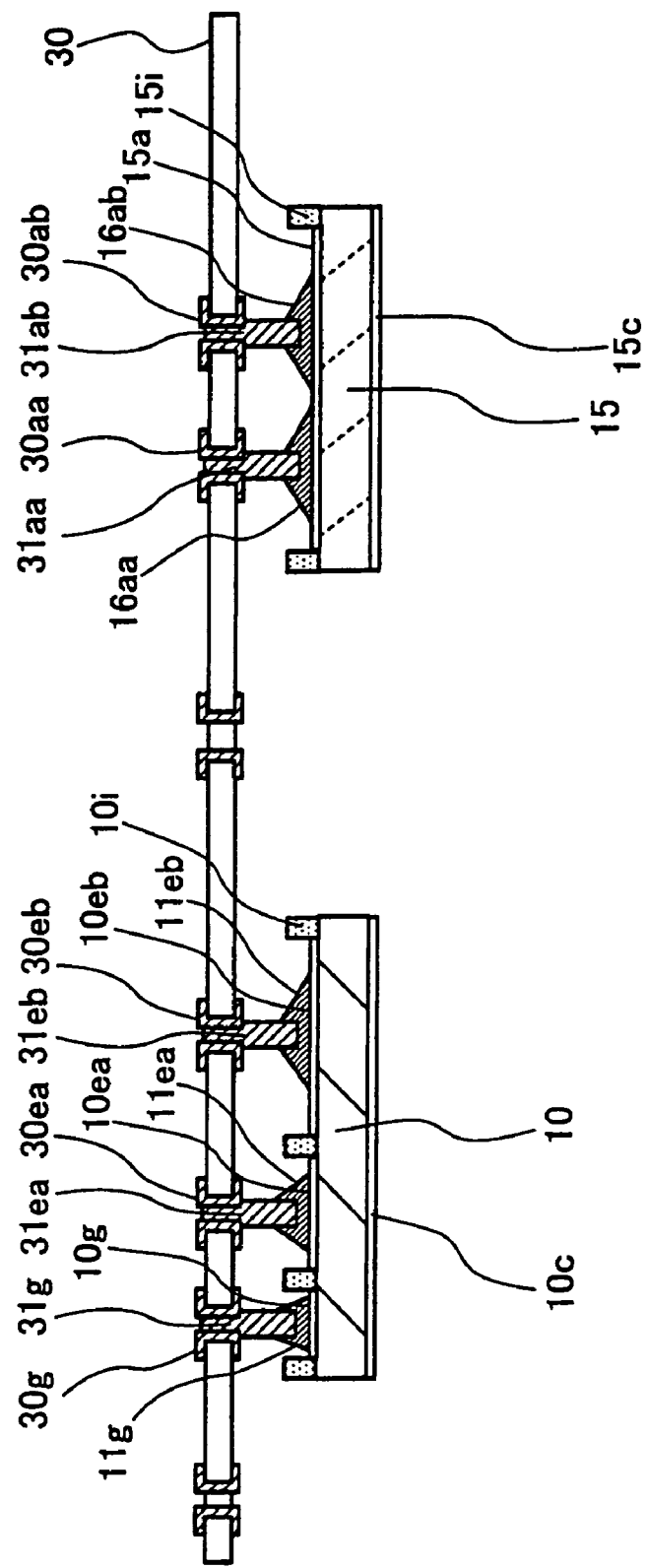
FIG. 17 is a fourth diagram to explain the semiconductor device manufacturing method of the second aspect.

As shown in FIG. 17, when the reflow treatment is continued for a prescribed length of time, the solder layers 11g, 11ea, 11eb, 16aa, 16ab spread and wet the side faces of the post electrodes 31g, 31ea, 31eb, 31aa, 31ab, and the solder layers 11g, 11ea, 11eb, 16aa, 16ab form fillets. This is due to the fact that the materials of the post electrodes 31g, 31ea, 31eb, 31aa, 31ab comprise copper (Cu), and as explained above, the solder layers have good wettability with respect to the post electrodes.

After formation of the fillets, the reflow treatment is halted, and the fastening jig is removed.

Figure 18:
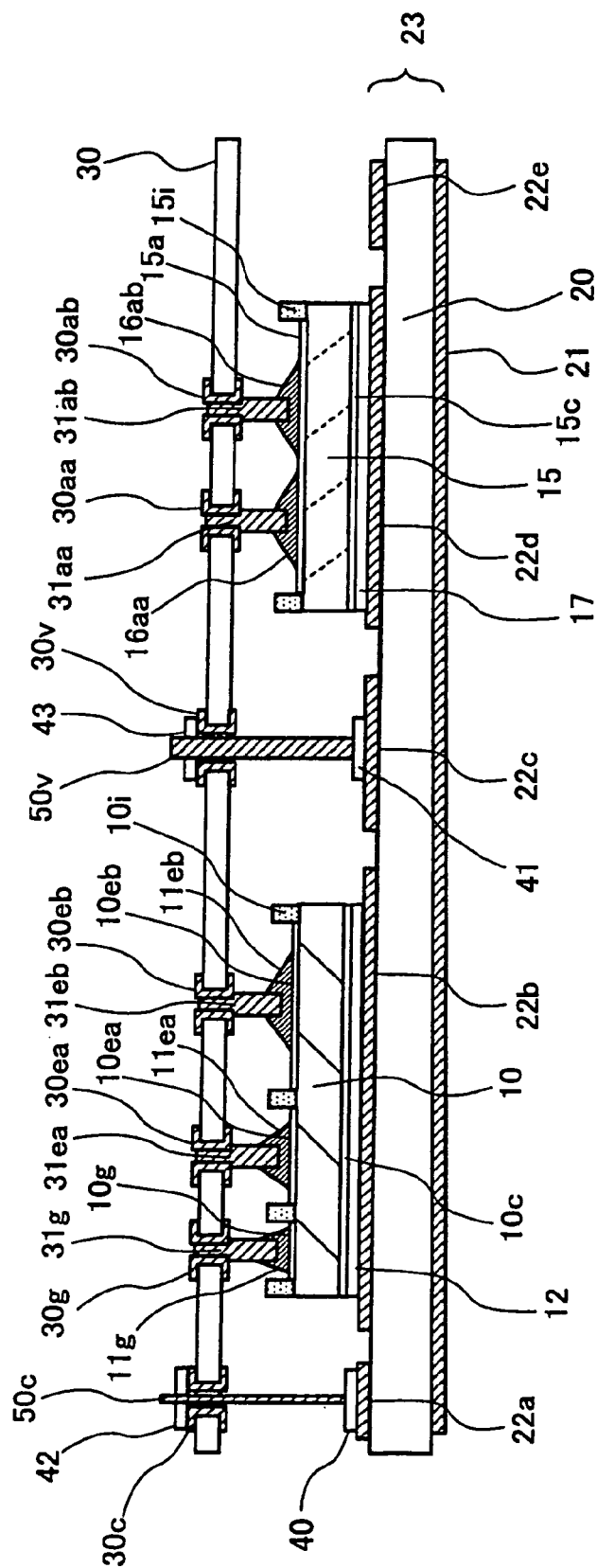
FIG. 18 is a fifth diagram to explain the semiconductor device manufacturing method of the second aspect.

Next, as shown in FIG. 18, an insulating board 23 is prepared, with metal foil 21, 22a to 22e formed in patterns by the DCB method on the upper and lower main faces of an insulating sheet 20, the main component of which is for example alumina ($Al_2O_3$) or silicon nitride ($Si_3N_4$). This insulating board 23 is fixed and supported on the lower face and side faces by means of, for example, a carbon fastening jig (not shown).

Next, the solder materials (second conductive bonding materials) 12 and 17 are placed on the metal foil 22b and metal foil 22d. The solder materials 12, 17 may have sheet shapes, or may be in paste form. Then, the semiconductor element 10 is placed on the solder material 12 such that the collector electrode 10c of the semiconductor element 10 is in contact with the solder material 12.

The semiconductor element 15 is placed on the solder material 17 such that the cathode 15c of the semiconductor element 15 is in contact with the solder material 17.

The solder materials 40, 41 are placed on the metal foils 22a, 22c respectively. These solder materials 40, 41 may be in sheet form, or may be in paste form.

A connection terminal for control 50c penetrates the wiring layer 30c of the wiring board 30. And, the lower end of the connection terminal 50c is brought into contact with the solder material 40. Also, the connection terminal 50v to provide connection to the main electrode of the semiconductor element 10, for example, penetrates the wiring layer 30v of the wiring board 30. And, the lower end of the connection terminal 50v is brought into contact with the solder material 41.

Ring-shape solder material 42 is placed on the wiring layer 30c penetrated by the connection terminal 50c. And, ring-shape solder material 43 is placed on the wiring layer 30v penetrated by the connection terminal 50v. Here the connection terminals 50c and 50v pass through the solder materials 42 and 43.

The material of the solder materials 40, 41, 42, 43 is for example a lead (Pb)-free solder, and specifically is an Sn 3.5%-Ag solder or other SnAg system solder, or an Sn 5%-Sb solder or other SnSb system solder. In addition, an SnAgCu system solder, SnAgBi system solder, SnAgIn system solder, SnCuBi system solder, SnCuIn system solder, or SnAgCu-NiGe system solder may be used.

Moreover, a lead (Pb)-containing solder (eutectic solder) may be used if necessary. Specifically, an Sn 5%-Pb solder, Sn 63%-Pb solder, or Sn 37%-Pb solder may be used.

The material of the connection terminals 50c, 50v has copper (Cu) as the main component.

Figure 19:
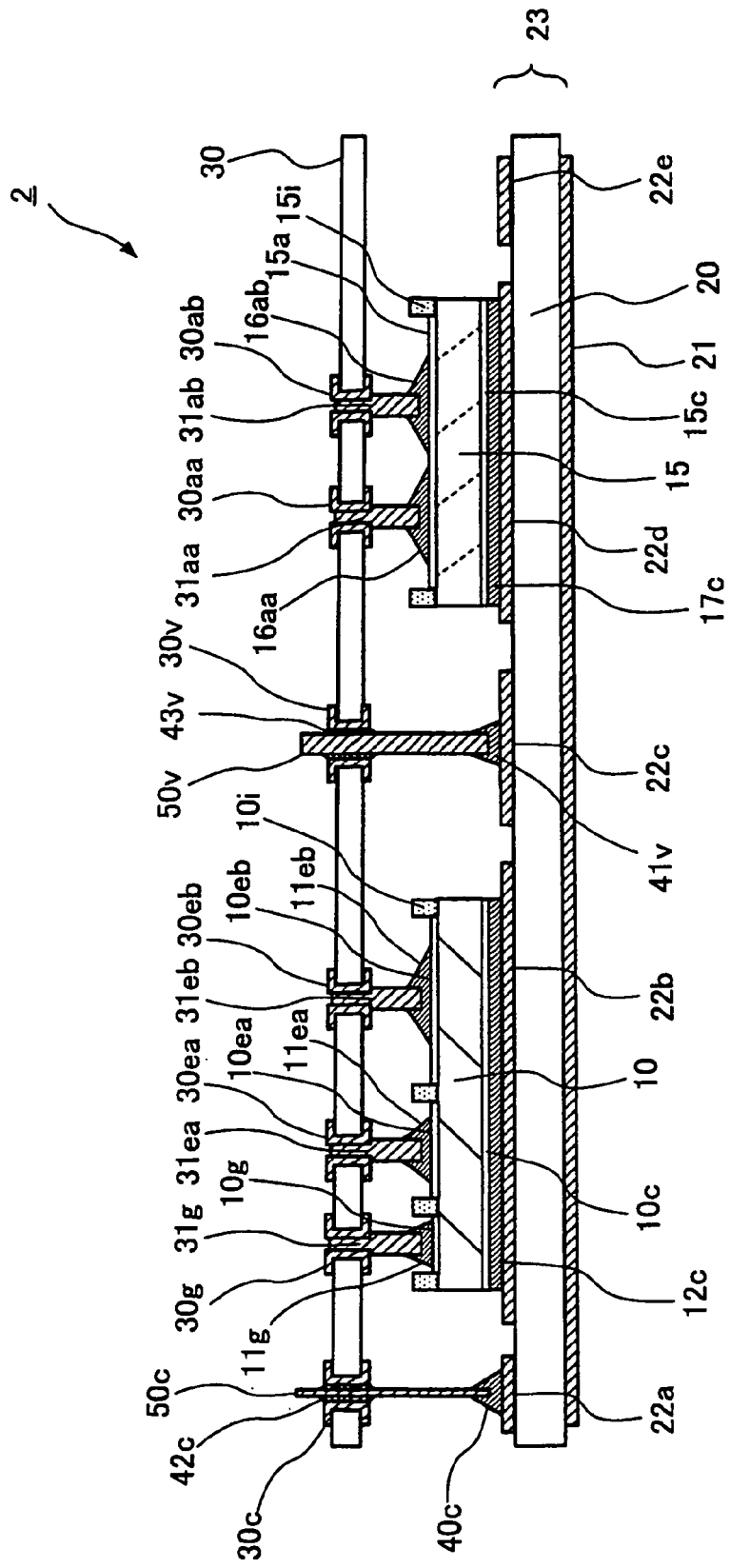
FIG. 19 is a sixth diagram to explain the semiconductor device manufacturing method of the second aspect.

Next, the reflow treatment is again performed, and as shown in FIG. 19, the solder materials 12, 17 as well as the solder materials 40, 41, 42, 43 are melted.

And, the collector electrode 10c of the semiconductor element 10 and the metal foil 22b are bonded via the solder layer 12c, and the cathode electrode 15c of the semiconductor element 15 and the metal foil 22d are bonded via the solder layer 17c.

Also, the lower end of the connection terminal 50c and the metal foil 22a are bonded via the solder layer 40c, and the other end of the connection terminal 50c and the wiring layer 30c are bonded via the solder layer 42c.

Also, the lower end of the connection terminal 50v and the metal foil 22c are bonded via the solder layer 41v, and the other end of the connection terminal 50v and the wiring layer 30v are bonded via the solder layer 43v.

The solder layers 40c and 41v spread and wet to the side faces of the connection terminals 50c and 50v, and the solder layers 40c and 41v form fillets.

Thereafter, molding is performed to fill the gap between the insulating board 23 and the wiring board 30 with a sealing resin (not shown), comprising, for example, epoxy resin or similar. By this means, the semiconductor elements 10, 15 and the post electrodes 31g, 31ea, 31eb, 31aa, 31ab, and similar are sealed with sealing resin.

Bonding of the collector electrode 10c and the metal foil 22b, and bonding of the cathode 15c and the metal foil 22d, may be performed by crimping or by ultrasonic bonding instead of soldering.

By means of this manufacturing method, the semiconductor device 2 shown is completed. The semiconductor device 2 may also be packaged using a PPS (polyphenylene sulfide) or other resin case, to form a general-use power module.

In the semiconductor device 2, a metal base plate several having a thickness of millimeters and broader in area than the insulating board 23 may be used as the base of the semiconductor device 2. By providing such a metal base plate, heat dissipation of the semiconductor device 2 is further improved.

Further, an IC circuit portion, capacitors, resistors, and other electronic components may be provided on the above-described wiring board 30. By this means the semiconductor device 2 can be made to function as a compact and thin intelligent power module, with a temperature sensor circuit, overvoltage/overcurrent protection circuit, and similar incorporated.

In this way, in the semiconductor device manufacturing method of the second aspect, the materials of the solder materials 11 and 16 and of the insulating layers 10i and 15i, the shapes of the solder materials 11 and 16 and of the insulating layers 10i and 15i, and the reflow treatment, are adjusted to the optimal conditions.

For example, utilizing the difference in wettability of the solder material 11 with respect to the electrode surfaces and insulating layer 10i, the surface tension of the solder material 11, and the weight of the solder material 11 itself, the solder material 11 is separated over each of the electrodes with the insulating layer 10i interposed. Then, the amounts and shapes of the solder layers positioned on each of the electrodes are adjusted.

By this means, even when there is variation in the heights of the post electrodes, all of the post electrodes can be electrically connected with reliability to the semiconductor element electrodes via the solder layers. These solder layers are separated reliably with the insulating layers provided on the semiconductor elements interposed, so that short-circuits between electrodes of the semiconductor element do not occur.

Further, because the solder materials 11, 16 used do not contain a flux component, after bonding of post electrodes and electrodes, there is no need for flux cleaning of the electrode surfaces.

Also, because the solder materials 11, 16 are in sheet form and are fluxless, during reflow treatment there is no scattering of a flux component or of solder material in the vicinity of the semiconductor elements 10, 15.

Further, the solder materials 11 and 16 are in sheet form, and alignment with the semiconductor elements 10, 15 is easy. And, the solder materials 11, 16 merely face and are positioned above the semiconductor elements 10, 15, so that there are no shifts in position of the semiconductor elements 10, 15 during manufacturing processes.

In this way, by means of the semiconductor device manufacturing method of the second aspect, semiconductor devices with high reliability and having excellent operating characteristics can be manufactured with high production yields.

Third Embodiment

Figure 20A:
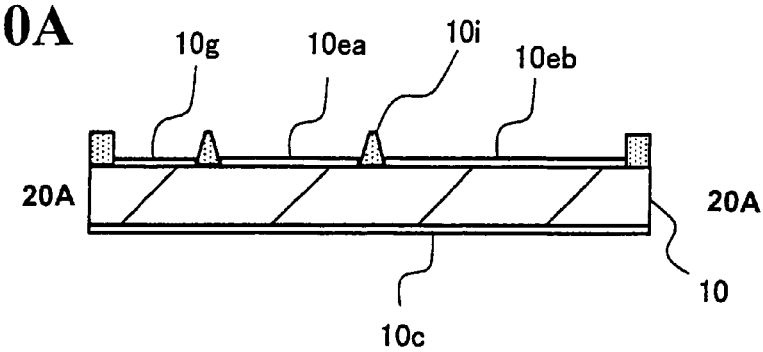
FIGS. 20A to 20C are diagrams to explain the semiconductor device manufacturing method of a third aspect.
Figure 20B:
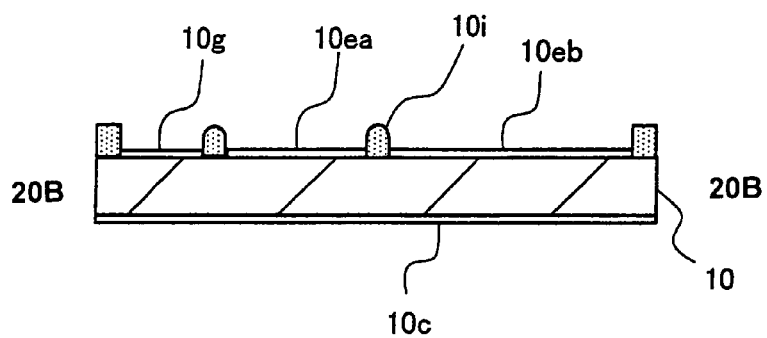
Figure 20C:
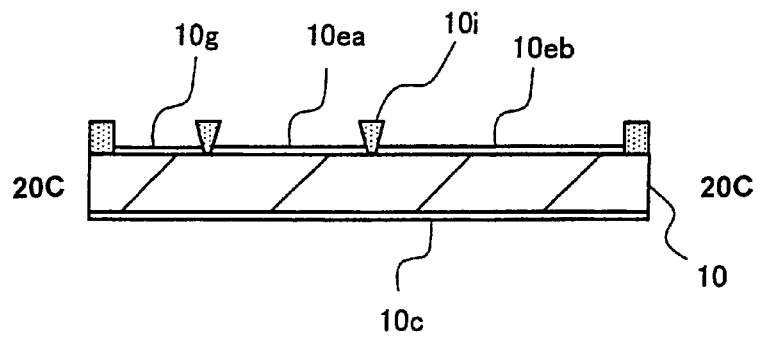
Figure 21:
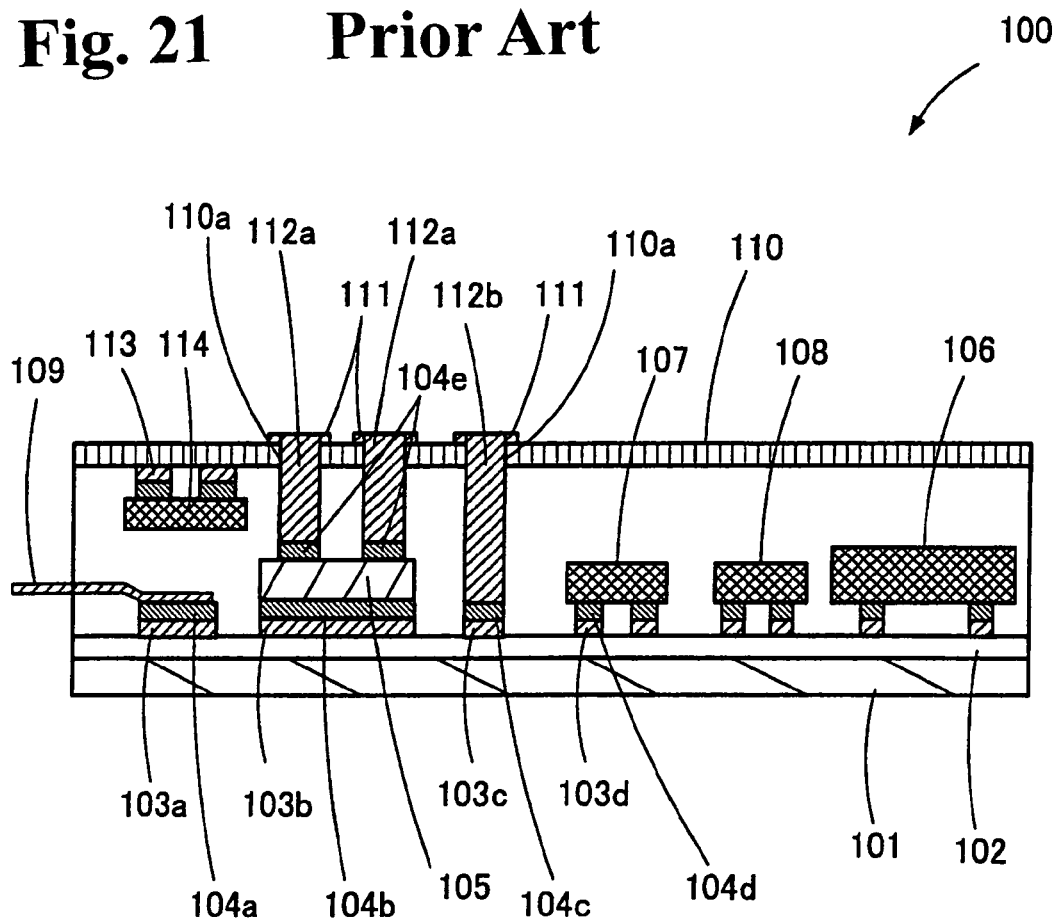
FIG. 21 shows principal portions of a conventional wireless-structure semiconductor device.

Next, the specific manufacturing method of the semiconductor device manufacturing method of a third aspect is explained, using FIGS. 20A to 20C. In the drawings described below, members which are the same as in the above FIG. 2 to FIG. 19 are assigned the same symbols, and detailed explanations are omitted.

FIGS. 20A to 20C show a modified example of a semiconductor element 10 used in the semiconductor device manufacturing method of the third aspect. In FIGS. 20A to 20C, cross-sectional views of the semiconductor element 10 at the position along the dashed lines 20A-20A, 20B-20B, 20C-20C, each corresponding to 2B-2B in FIGS. 2A and 2B, are shown.

For example, the insulating layer 10i which separates the gate electrode 10g and the emitter electrode 10ea of the semiconductor element 10, or the insulating layer 10i which separates the emitter electrodes 10ea and 10eb, may have a tapered shape, as shown in FIG. 20A. Or, as shown in FIG. 20B, the tip end of the insulating layer 10i may have a round shape. Or, as shown in FIG. 20C, the insulating layer 10i may have a reverse-taper (inverted triangular) shape.

By means of these cross-sectional shapes of the insulating layer 10i, when the reflow of the solder material 11 is performed, still more reliable separation into the solder layer 11g and the solder layers 10ea and 11eb can be achieved.

The disclosure of Japanese Patent Application No. 2008-077478 filed on Mar. 25, 2008 is incorporated as a reference.

While the invention has been explained with reference to the specific embodiments of the invention, the explanation is illustrative and the invention is limited only by the appended claims.

What is claimed is:

1. A semiconductor device manufacturing method, comprising the steps of:
    preparing a semiconductor element having at least one first electrode, at least one second electrode, and a third electrode arranged so as to face the first electrode and second electrode, the first electrode and second electrode being electrically separated in a same plane by an insulating layer;
    arranging a first conductive bonding material on a first metal foil formed on a main face of an insulating sheet, and placing the semiconductor element on the first conductive bonding material so that the third electrode contacts the first conductive bonding material;
    supporting a sheet-shape second conductive bonding material by the insulating layer so as to face the first electrode and the second electrode;
    arranging a lower end of at least one first post electrode and a lower end of at least one second post electrode above the first electrode and second electrode respectively with the second conductive bonding material intervening therebetween, said at least one first post electrode and said at least one second post electrode being electrically connected to a wiring layer arranged on a wiring board; and
    melting the second conductive bonding material so as to form a first conductive bonding layer for bonding the first electrode and the first post electrode, and a second conductive bonding layer for bonding the second electrode and the second post electrode, said first and second conductive bonding layers being separated with the insulating layer, and melting the first conductive bonding material to form a third conductive bonding layer for bonding the third electrode and the first metal foil.

2. The semiconductor device manufacturing method according to claim 1, wherein, prior to melting the second conductive bonding material, the first electrode and the second electrode, or the first post electrode and the second post electrode, are subjected to preprocessing.

3. The semiconductor device manufacturing method according to claim 1, wherein the second conductive bonding material has a thickness of 50 μm or greater and 150 μm or less.

4. The semiconductor device manufacturing method according to claim 1, wherein the second conductive bonding material has a contact angle with the insulating layer greater than that with the first electrode or with the second electrode.

5. The semiconductor device manufacturing method according to claim 1, wherein the second conductive bonding material has a contact angle with the insulating layer greater than that with the first post electrode or with the second post electrode.

6. The semiconductor device manufacturing method according to claim 1, wherein the insulating layer has a height greater than that of the second conductive bonding layer formed on the second electrode, and lower than a gap between the semiconductor element and the wiring board.

7. The semiconductor device manufacturing method according to claim 1, wherein the insulating layer has a height equal to or greater than 50 μm and smaller than a gap between the semiconductor element and the wiring board.

8. The semiconductor device manufacturing method according to claim 1, wherein the insulating layer has a height smaller than 50 μm.

9. The semiconductor device manufacturing method according to claim 1, wherein the insulating layer has a line width equal to or greater than 200 μm.

10. The semiconductor device manufacturing method according to claim 1, wherein the insulating layer has a cross-section having a rectangular, a triangular, a round, or an inverted-triangle shape.

11. The semiconductor device manufacturing method according to claim 1, further comprising the steps of:
    forming another semiconductor element having a fourth electrode bonded to a third post electrode electrically connected to another wiring layer of the wiring board via a fourth conductive bonding layer, and a fifth electrode facing the fourth electrode and bonded to a second metal foil formed on the main face of the insulating sheet via a fifth conductive bonding layer.

12. A semiconductor device manufacturing method, comprising the steps of:
    preparing a semiconductor element having at least one first electrode and at least one second electrode, the first electrode and second electrode being electrically separated in a same plane by an insulating layer;
    supporting a sheet-shape first conductive bonding material by the insulating layer so as to face the first electrode and second electrode;
    arranging a lower end of at least one first post electrode and a lower end of at least one second post electrode above the first electrode and second electrode respectively with the first conductive bonding material intervening therebetween, said at least one first post electrode and said at least one second post electrode being electrically connected to a wiring layer arranged on a wiring board; and melting the first conductive bonding material so as to form a first conductive bonding layer for bonding the first electrode and the first post electrode, and a second conductive bonding layer for bonding the second electrode and the second post electrode, said first and second conductive bonding layers being separated with the insulating layer.

13. The semiconductor device manufacturing method according to claim 12, further comprising the steps of:
after the step of melting the first conductive bonding layer, forming a third electrode in the semiconductor element, the third electrode facing the first and second electrodes,
forming a second conductive bonding material on a first metal foil formed on a main face of an insulating sheet, and placing the semiconductor element on the first metal foil so that the third electrode contacts the first metal foil via the second conductive bonding material; and
melting the second conductive bonding material to form a third conductive bonding layer and bond the third electrode and the first metal foil via the third conductive bonding layer.

14. The semiconductor device manufacturing method according to claim 13, further comprising the step of forming another semiconductor element having a fourth electrode and a third post electrode bonded with the fourth electrode via a fourth conductive bonding layer.

15. The semiconductor device manufacturing method according to claim 14, further comprising the steps of:
forming a fifth electrode in the another semiconductor element so as to face the fourth electrode, and
forming a second metal foil on the main face of the insulating sheet and a fifth conductive bonding layer on the second metal foil so as to bond the fifth electrode and the second metal foil via the fifth conductive bonding layer.

16. The semiconductor device manufacturing method according to claim 13, further comprising the steps of:
bonding a connection terminal penetrating the wiring board and another wiring layer provided on the wiring board at one end of the connection terminal via a sixth conductive bonding layer, and
bonding the other end of the connection terminal and a third metal foil formed on the main face of the insulating sheet via a seventh conductive bonding layer.

* * * * *